(12) United States Patent
Chen et al.

(10) Patent No.: US 11,757,010 B2
(45) Date of Patent: Sep. 12, 2023

(54) MULTI-STAGE ETCHING PROCESS FOR CONTACT FORMATION IN A SEMICONDUCTOR DEVICE

(71) Applicant: Taiwan Semiconductor Manufacturing Company Limited, Hsinchu (TW)

(72) Inventors: Shu-Wen Chen, Hsinchu (TW); Guan-Ren Wang, Hsinchu (TW); Ching-Feng Fu, Taichung (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 78 days.

(21) Appl. No.: 17/166,564

(22) Filed: Feb. 3, 2021

(65) Prior Publication Data
US 2021/0336013 A1 Oct. 28, 2021

Related U.S. Application Data

(60) Provisional application No. 63/016,430, filed on Apr. 28, 2020.

(51) Int. Cl.
| | |
|---|---|
| H01L 29/40 | (2006.01) |
| H01L 21/311 | (2006.01) |
| H01L 29/78 | (2006.01) |
| H01L 29/417 | (2006.01) |
| H01L 29/66 | (2006.01) |
| H01L 21/8234 | (2006.01) |
| H01L 21/768 | (2006.01) |

(52) U.S. Cl.
CPC ...... H01L 29/401 (2013.01); H01L 21/31116 (2013.01); H01L 21/76897 (2013.01); H01L 21/823475 (2013.01); H01L 29/41791 (2013.01); H01L 29/66795 (2013.01); H01L 29/7851 (2013.01); *H01L 21/823481* (2013.01)

(58) Field of Classification Search
CPC .................. H01L 21/76897; H01L 21/823481
See application file for complete search history.

(56) References Cited

U.S. PATENT DOCUMENTS

| | | | |
|---|---|---|---|
| 2016/0163646 A1 | 6/2016 | Yang et al. | |
| 2018/0040702 A1* | 2/2018 | Chang | H01L 21/76814 |
| 2018/0261599 A1 | 9/2018 | Sun et al. | |
| 2019/0096765 A1* | 3/2019 | Ching | H01L 21/823418 |

FOREIGN PATENT DOCUMENTS

TW 201933613 A 8/2019

* cited by examiner

*Primary Examiner* — Farun Lu
(74) *Attorney, Agent, or Firm* — FOLEY & LARDNER LLP

(57) ABSTRACT

A method of fabricating a semiconductor device is disclosed. The method includes separating an interlayer dielectric (ILD) into a plurality of portions. The plurality of portions of ILD, separated from each other along a first lateral direction and a second lateral direction, overlay a plurality of groups of epitaxial regions, respectively. The method includes performing an etching process to expose the plurality of groups of epitaxial regions, wherein the etching process comprises a plurality of stages, each of the stages comprising a respective etchant. The method includes forming a plurality of conductive contacts electrically coupled to the plurality of epitaxial regions, respectively.

20 Claims, 26 Drawing Sheets

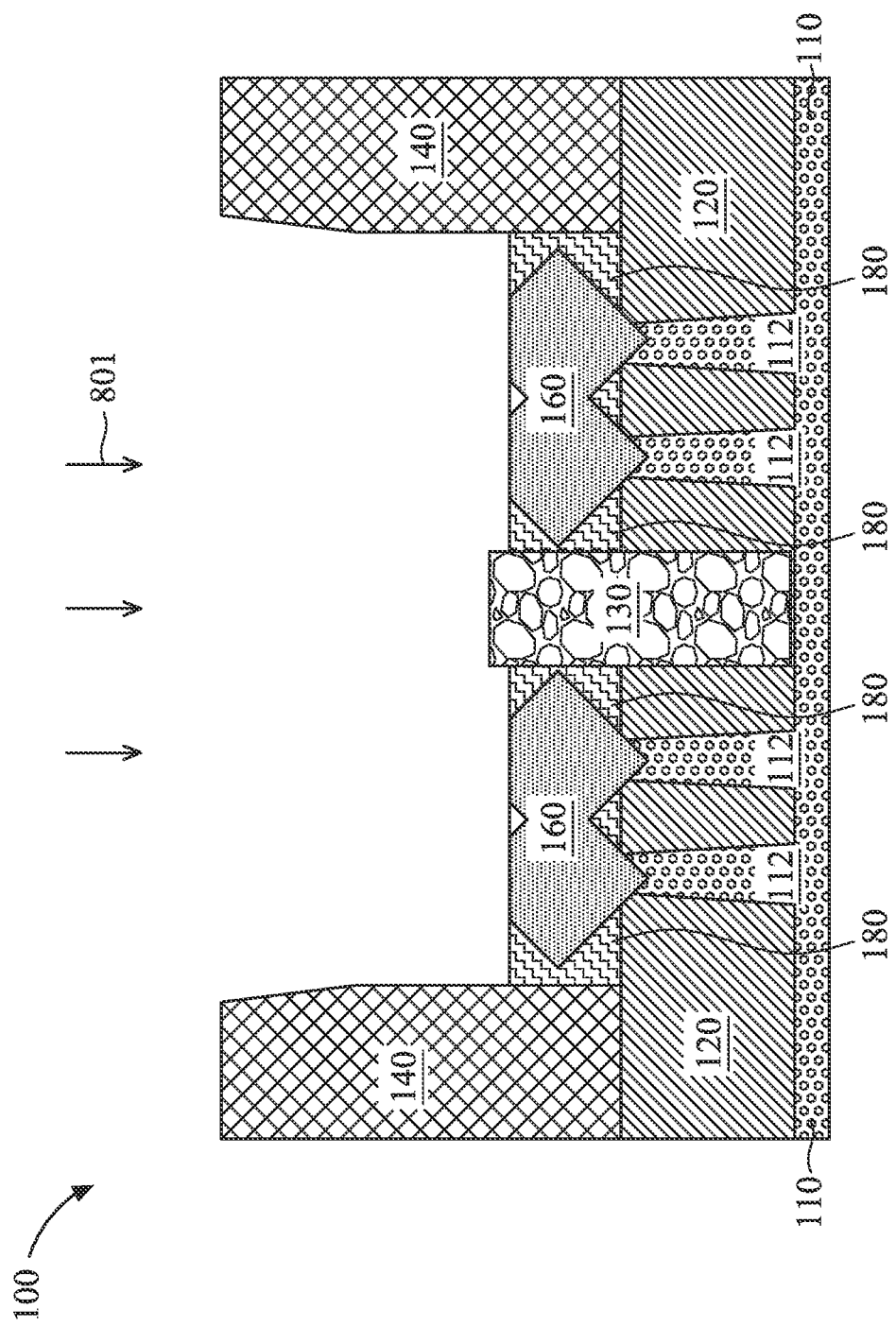

MULTI-STAGE ETCHING PROCESS FOR CONTACT FORMATION IN A SEMICONDUCTOR DEVICE

CROSS-REFERENCE TO RELATED PATENT APPLICATION

This application claims the benefit of and priority to U.S. Provisional Patent Application No. 63/016,430 filed Apr. 28, 2020, the entire disclosure of which is incorporated by reference herein.

BACKGROUND

The present disclosure generally relates to semiconductor devices and methods for fabricating semiconductor devices, and particularly to conductive contact formation in semiconductor device. Semiconductor devices are used in a wide variety of electronics, and improvements regarding both production and performance of semiconductor devices are generally desired. As the feature size of semiconductor devices continues to decrease, challenges may arise in the fabrication process with respect to formation of conductive contacts in areas such as source and drain terminals of transistors. Improvements in the semiconductor fabrication process to provide improvements in formation of such contacts are generally desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 3B, 3C, 4A, 4B, 4C, 5A, 5B, 5C, 6A, 6B, 6C, 7A, 7B, 7C, 8A, 8B, 8C, 9A, 9B, and 9C illustrate cross-sectional views of the integrated circuit of FIG. 1A, at various fabrication stages, in accordance with some embodiments.

DETAILED DESCRIPTION

Figure 1A:
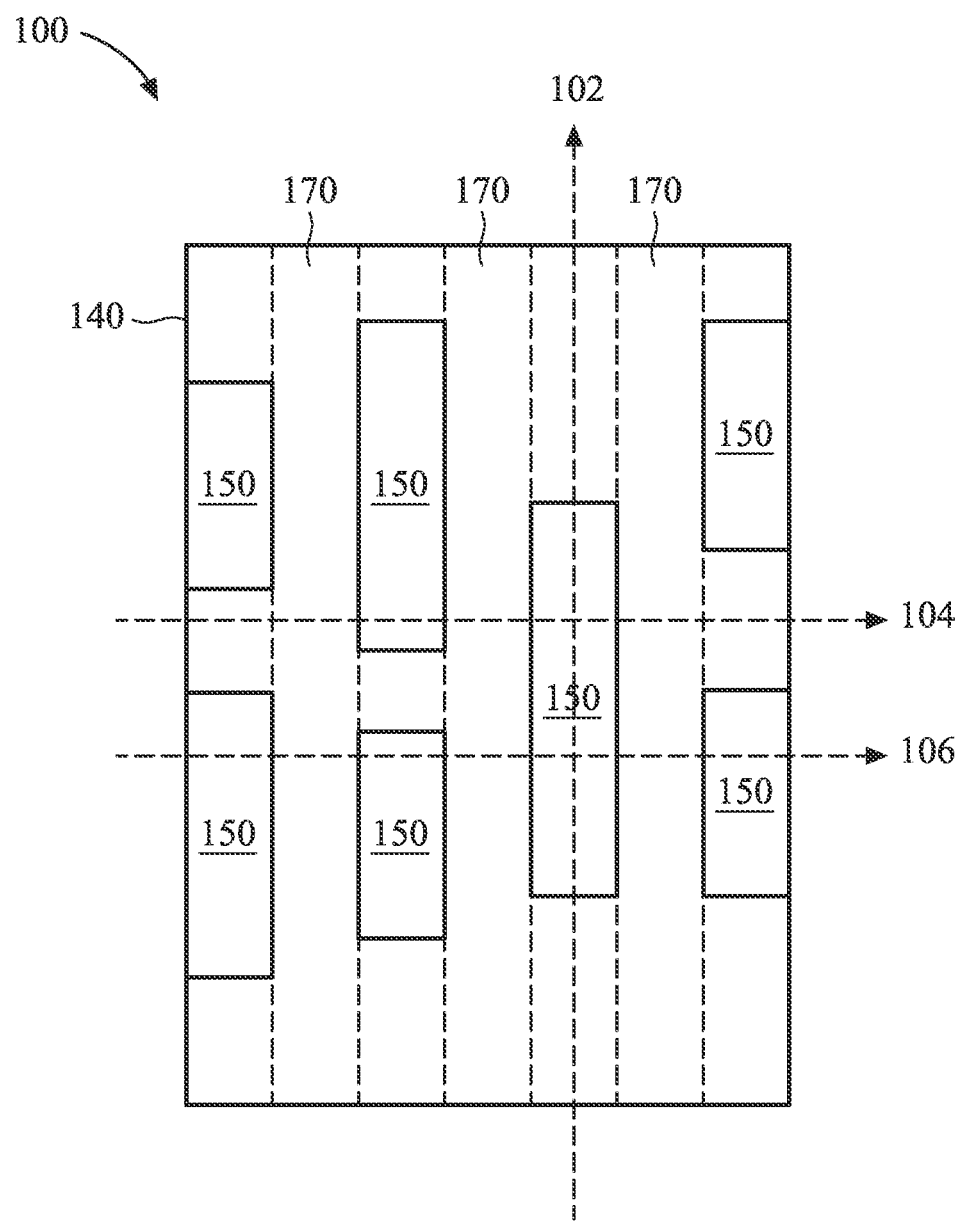
FIG. 1A illustrates a top view of an example integrated circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a semiconductor device and method for fabricating a semiconductor device using a multi-stage etching process for formation of conductive contacts within the semiconductor device as implemented in an integrated circuit. In various embodiments, a dielectric structure is formed as a two-dimensional mesh-like structure to isolate different gate structures and different groups of source/drain structures. Each of the stages can have an etching selectivity between at least two features/layers. For example, the multi-stage etching process includes a first stage configured to isotropically etch an interlayer dielectric (ILD) overlaying the groups of source/drain structures at a higher rate than a metal-containing isolation structure separating the source/drain structures in each group. Next, the multi-stage etching process includes a second stage configured to etch the metal-containing isolation structure, while leaving the remaining ILD intact. Next, the multi-stage etching process includes a third stage configured to anisotropically the remaining ILD. By using the multi-stage etching process as disclosed herein, the loss of a hard mask typically used to define the different groups can be significantly reduced, which can advantageously increase a process window to form the conductive contacts.

Referring now to FIG. 1A, a top view of a portion of an example integrated circuit 100 during one of various fabrication stages is shown, in accordance with some embodiments. The integrated circuit 100 is generally a chip with a multitude of individual devices (e.g. transistors, capacitors, resistors, etc.) formed thereon. The techniques described in the present disclosure can be applied in a variety of different types of semiconductor devices including both planar and three-dimensional devices.

Figure 1B:
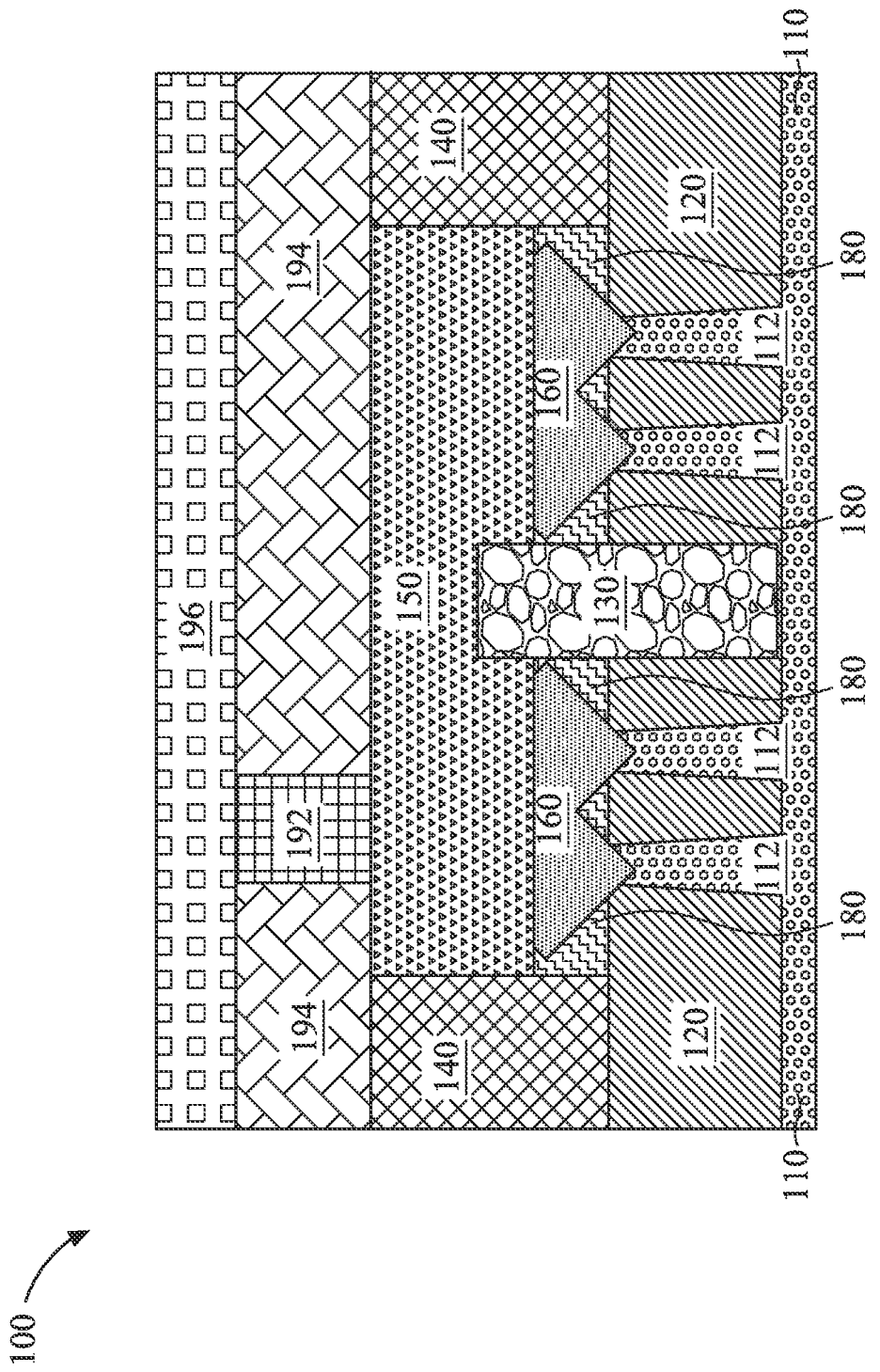
FIG. 1B illustrates a cross-sectional view of the integrated circuit of FIG. 1A, in accordance with some embodiments.
Figure 1C:
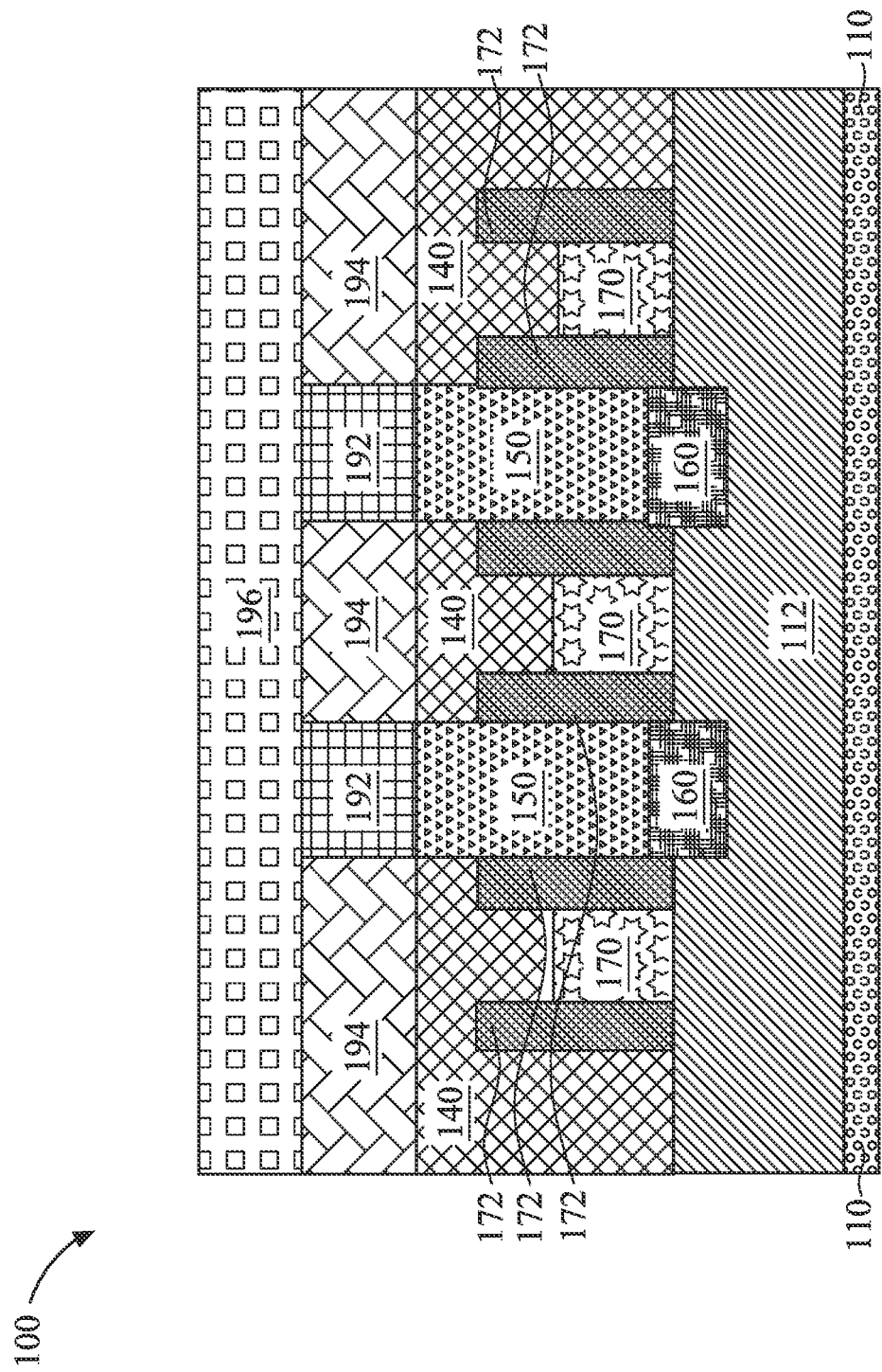
FIG. 1C illustrates another cross-sectional view of the integrated circuit of FIG. 1A, in accordance with some embodiments.
Figure 1D:
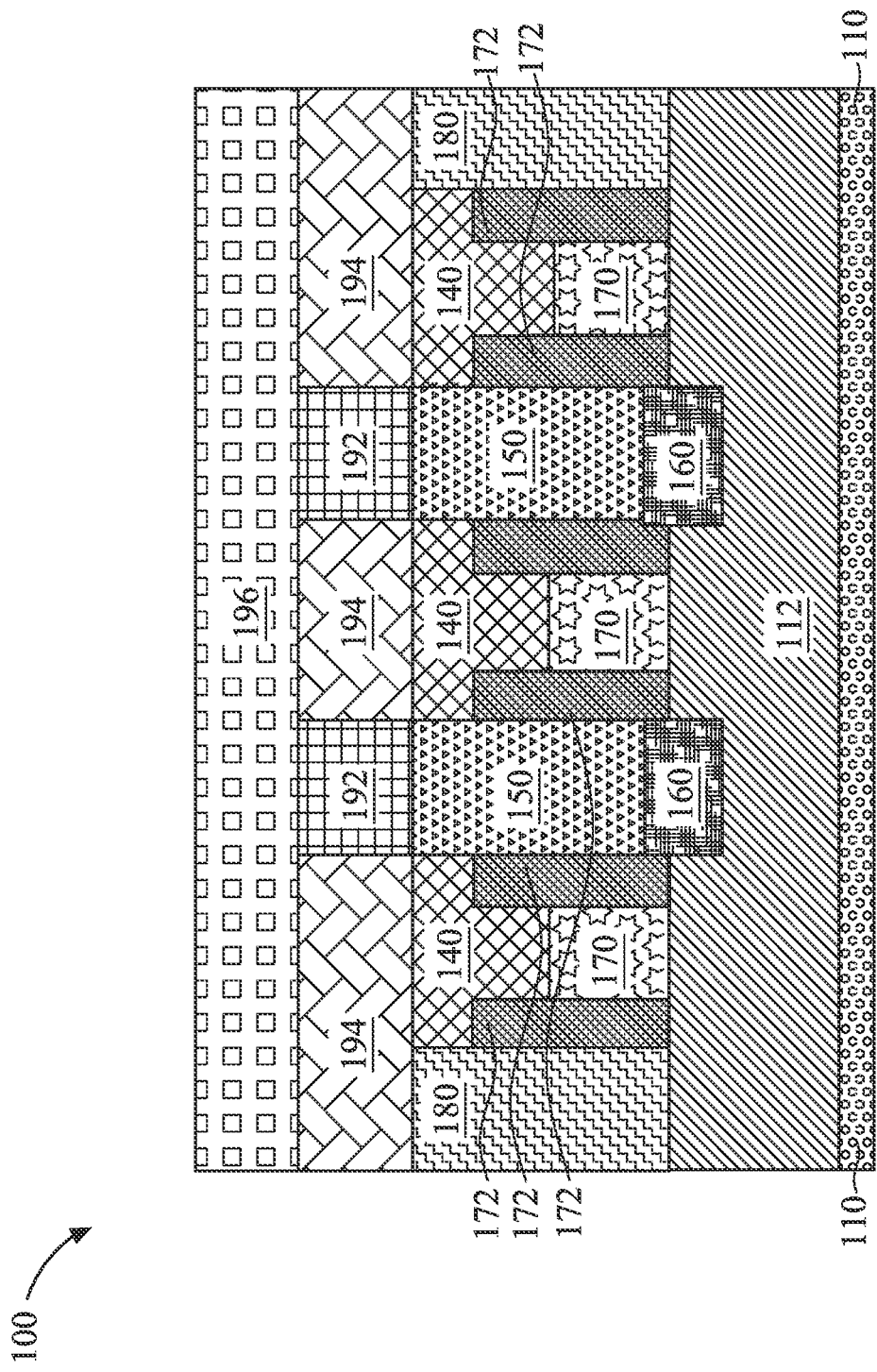
FIG. 1D illustrates yet another cross-sectional view of the integrated circuit of FIG. 1A, in accordance with some embodiments.

During this fabrication stage, a number of conductive contacts (e.g., 150) can be formed in the integrated circuit 100. The conductive contacts can be (e.g., electrically) isolated from one another by a dielectric structure (e.g., 140) formed in a two-dimensional mesh. Each of the conductive contacts can (e.g., electrically) connect to a group of source/drain structures. Corresponding to the same fabrication stage, FIGS. 1B, 1C, and 1D illustrate cross-sectional views of the integrated circuit 100, cut in different directions (as indicated in FIG. 1A), respectively. For example, the cross-sectional view of FIG. 1B is cut along direction 102; the cross-sectional view of FIG. 1C is cut along direction 104; and the cross-sectional view of FIG. 1D is cut along direction 106.

As shown in the cross-sectional views of FIG. 1B, the integrated circuit 100 is shown to include a substrate 110 and a number of active fin structures 112. Substrate 110 can be implemented using a variety of different structures and materials. For example, substrate 110 can be implemented as a bulk silicon substrate, a silicon-insulator-silicon substrate, a silicon-on-sapphire substrate, and other types of substrates. Further, substrate 110 can be formed using a variety of different materials and combinations thereof. Active fin structures 112, including one or more semiconductor materials, are formed over (e.g., to protrude from) substrate 110. For example, active fin structures 112 can be formed using silicon material or other suitable conductive materials and combination thereof. In various embodiments, active fin structures 112 can all extend along a first lateral direction (e.g., direction 104, 106), with a number of gate structures extending along a second lateral direction (e.g., direction 102) and in parallel with conductive contacts 150, which will be discussed in further detail below. Active fin structure 112 can be used to form transistors within integrated circuit 100, such as fin field-effect transistors (FinFETs). As such, active fin structures 112 are configured to conduct currents within the respective transistors. Such active fin structures are sometimes referred to as conduction channels, or channels.

The integrated circuit 100 is also shown to include an isolation region 120. In some embodiments, isolation region 120 is implemented as a shallow trench isolation (STI) structure. Isolation region 120 can be formed by creating trenches within substrate 110, filling the trenches with insulating material (e.g. dielectric material such as silicon dioxide), and removing excess insulating material using processes such as chemical-mechanical polishing (CMP). Active fin structures 112 are generally the same or similar in terms of size and shape.

The integrated circuit 100 is also shown to include an inactive fin structure 130. For example, inactive fin structure 130 can be implemented as a dummy fin. Inactive fin structure 130 is not electrically conductive as active fin structures 112 are, and thus does not provide a pathway for electrical current to flow. Instead, inactive fin structure 130 can reduce strain on substrate 110 by providing a structure similar to active fin structures 112 in inactive regions of integrated circuit 100. As shown in FIG. 1B, two active fin structures 112 are formed on a first side of inactive fin structure 130, and two more active fin structures 112 are formed on a second side of inactive fin structure 130 opposite the first side. Active fin structures 112 are disposed on opposing sides of inactive fin structure 130 and in parallel relation to inactive fin structure 130.

The inclusion of inactive fin structure 130 can further provide critical dimension (CD) uniformity and can thereby provide improved ease and efficiency with respect to fabrication of integrated circuit 100 as well improved performance of integrated circuit 100. In some embodiments, inactive fin structure 130 is the same or about the same in size and shape as active fin structures 112. However, inactive fin structure 130 can also be implemented as being larger, smaller, thicker, thinner, taller, or shorter when compared to active fin structures 112. Inactive fin structure 130 can be formed as a single film or a complex film, and can be formed using materials such as silicon dioxide ($SiO_2$), silicon oxynitride (SiON), silicon nitride ($Si_3N_4$), silicon carbon nitride (SiCN), silicon oxycarbonitride (SiOCN), hafnia ($HfO_2$), tantalum nitride (TaN), and other suitable materials and combinations thereof. In some embodiments, the width of inactive fin structure 130 ranges from 10 nanometers to 20 nanometers, and the distance between inactive fin structure 130 and the closest active fin structure 112 also ranges from 10 nanometers to 20 nanometers. However, dimensions outside of these ranges can also be contemplated.

Integrated circuit 100 is also shown to include epitaxial regions/structures 160. In various embodiments, the epitaxial regions 160 can each be configured as the source structure or the drain structure of a corresponding transistor. Accordingly, epitaxial regions 160 may sometimes be referred to as source/drain structures 160. As illustrated in FIG. 1B, epitaxial regions 160 include both a first epitaxial region formed on active fin structures 112 as well as a second epitaxial region formed on active fin structures 112, wherein the first epitaxial region and the second epitaxial region are disposed on opposing sides of inactive fin structure 130. Epitaxial regions 160 can be formed using epitaxial growth processes such as chemical vapor deposition (CVD), vapor-phase epitaxy (VPE), molecular-beam epitaxy (MBE), liquid-phase epitaxy (LPE), and other suitable processes and combinations thereof. Epitaxial regions 160 can be doped using suitable dopants including n-type and p-type dopants such as arsine, phosphine, diborane, and other suitable dopants and combinations thereof.

Integrated circuit 100 is also shown to include conductive contact 150. Conductive contact 150 is electrically coupled to epitaxy regions 160 in order to route electrical signals to and from epitaxy regions 160. For example, conductive contact 150 can be electrically coupled to an interconnect structure such as conductive line 192 described below to connect epitaxy regions to wiring within integrated circuit 100. In some embodiments, conductive contact 150 may be a self-aligned contact (SAC). The term SAC, as used herein, can be referred to as a contact that is formed without requiring a mask. As will be discussed in more detail below, the use of dielectric structure 140 and/or the use of the below discussed multi-stage etching process can facilitate improved formation of conductive contact 150.

Integrated circuit 100 is also shown to include an ILD 180 and a dielectric structure 140. In various embodiments, ILD 180 has a first etch rate and dielectric structure 140 has a second, different etch rate, with respect to a certain etchant, which allows the conductive contact 150 to be surrounded by different portions of the dielectric structure 140. For example, the dielectric structure 140 may remain substantially intact during etching the ILD 180. Accordingly, ILD 180 and dielectric structure 140 are formed using different materials or combinations of materials. In some embodiments, dielectric structure 140 includes silicon nitride (SiN); and ILD 180 includes dielectric materials with a low dielectric constant (low-k materials), including materials such silicon dioxide ($SiO_2$), silicon oxynitride (SiON), silicon carbon nitride (SiCN), silicon oxycarbonitride (SiOCN), and combinations thereof. However, other materials are contemplated for forming both dielectric structure 140 and dielectric region 180. Partially due to the etch selectivity between dielectric structure 140 and ILD 180, use of dielectric structure 140 can provide one or more advantages including less hard mask loss, removal of metal oxide material disposed on inactive fin structure 130, and better epitaxy landing control when forming epitaxial regions 160, among other possible benefits such as discussed in greater detail below. As better appreciated in the top view of FIG. 1A, dielectric structure 140 is formed as a two-dimensional mesh structure, which includes a number of portions that each surround one of the conductive contacts 150. Alternatively stated, dielectric structure 140 includes a number of meshes (or otherwise openings) that are filled with different portions of ILD 180, respectively.

In the cross-sectional views of FIGS. 1B-D, the integrated circuit 100 is also shown to include a conductive line 192, an ILD 194, and a passivation layer 196, which are not shown in the top view of FIG. 1A for purposes of clarification. These structures can provide routing of electrical signals to and from conductive contact 150, thereby electrically coupling conductive contact 150 to other areas of integrated circuit 100. For example, conductive line 192 can be implemented as a via structure or a plug structure, and can be formed of a conductive material such as copper, aluminum, tungsten, and other suitable materials and combinations thereof. ILD 194 is formed adjacent conductive line 192 and provides electrical isolation of conductive line 192. ILD 194 includes a similar material as ILD 180, and thus the discussions are not repeated. Passivation layer 196 is generally a chip passivation layer that provides an outer shield for integrated circuit 100. For example, passivation layer 196 can be formed using an oxidation process such as a thermal oxidation process, and can be formed using materials such as silicon dioxide, nickel, stainless steel, aluminum, and other suitable materials and combinations thereof. It will be appreciated that integrated circuit 100 can include additional interconnect layers between dielectric layer 194 and passivation layer 196 although not expressly illustrated.

Referring now to FIG. 1C, a number of gate structures 170 of integrated circuit 100 can be seen. Gate structures 170 each serve as a gate for a corresponding transistor. Gate structures 170 can each be implemented as a high-k metal gate (HKMG) structure. In such implementations, a stack including conductive metal material and dielectric material with a high dielectric constant (high-k) is formed. The stack can also include a work function layer, a capping layer, and/or other layers to form a suitable HKMG structure for the intended application. The HKMG structure can be formed using a variety of suitable processes, including both gate-first and gate-last implementations. As indicated in dotted lines in FIG. 1A, gate structures 170 can be disposed in generally parallel relation (e.g., extending in parallel with direction 102 of FIG. 1A), and can be part of a parallel gate stack. However, gate structures 170 can be implemented in a variety of ways, including implementations as polysilicon gate structures, among other types of gate structures. Gate structures 170 are generally formed on active fin structures 112.

Also shown in FIG. 1C is a plurality of gate spacer structures 172. Spacer structures 172 can be implemented using a single layer of material or multiple layers of material, and can be implemented using dielectric materials with a high dielectric constant (high-k materials), dielectric materials with a low dielectric constant (low-k materials), or a combination thereof, including materials such silicon dioxide ($SiO_2$), silicon oxynitride (SiON), silicon nitride ($Si_3N_4$), silicon carbon nitride (SiCN), silicon oxycarbonitride (SiOCN), hafnia ($HfO_2$), tantalum nitride (TaN), and other suitable materials and combinations thereof. Spacer structures 172 generally provide electrical isolation for gate structures 170 to prevent charge leakage and thereby improved performance.

Figure 2:
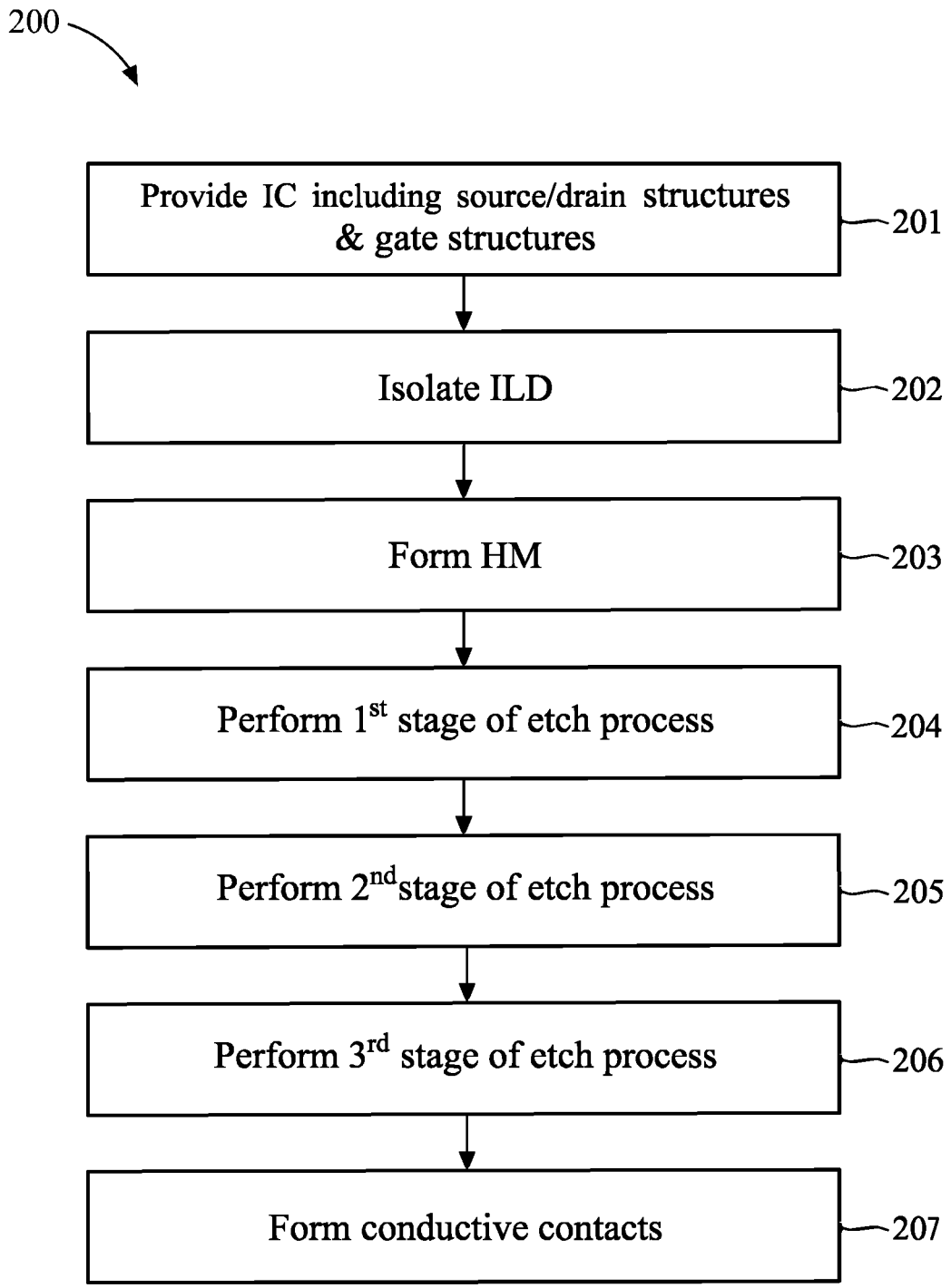
FIG. 2 is a flow diagram illustrating an example method for fabricating the integrated circuit of FIG. 1A, in accordance with some embodiments.

Referring now to FIG. 2, a flow diagram illustrating an example method 200 for fabricating an integrated circuit is shown, in accordance with some embodiments. For example, at least some of the operations of the method 200 can be used to form an integrated circuit (e.g., integrated circuit 100) including a number of FinFETs, nanosheet transistors, nanowire transistors, vertical transistors, or the like. It is noted that the method 200 is merely an example, and is not intended to limit the present disclosure. Accordingly, it is understood that additional operations may be provided before, during, and after the method 200 of FIG. 2, and that some other operations may only be briefly described herein.

In some embodiments, operations of the method 200 may be associated with cross-sectional views of integrated circuit 100 at various fabrication stages as shown in FIGS. 3A, 3B, 3C, 4A, 4B, 4C, 5A, 5B, 5C, 6A, 6B, 6C, 7A, 7B, 7C, 8A, 8B, 8C, 9A, 9B, and 9C, respectively. In particular, the cross-sectional views of FIGS. 3A, 4A, 5A, 6A, 7A, 8A, and 9A are cut along direction 102 (FIG. 1A); the cross-sectional views of FIGS. 3B, 4B, 5B, 6B, 7B, 8B, and 9B are cut along direction 104 (FIG. 1A); and the cross-sectional views of FIGS. 3C, 4C, 5C, 6C, 7C, 8C, and 9C are cut along direction 106 (FIG. 1A).

Figure 3A:
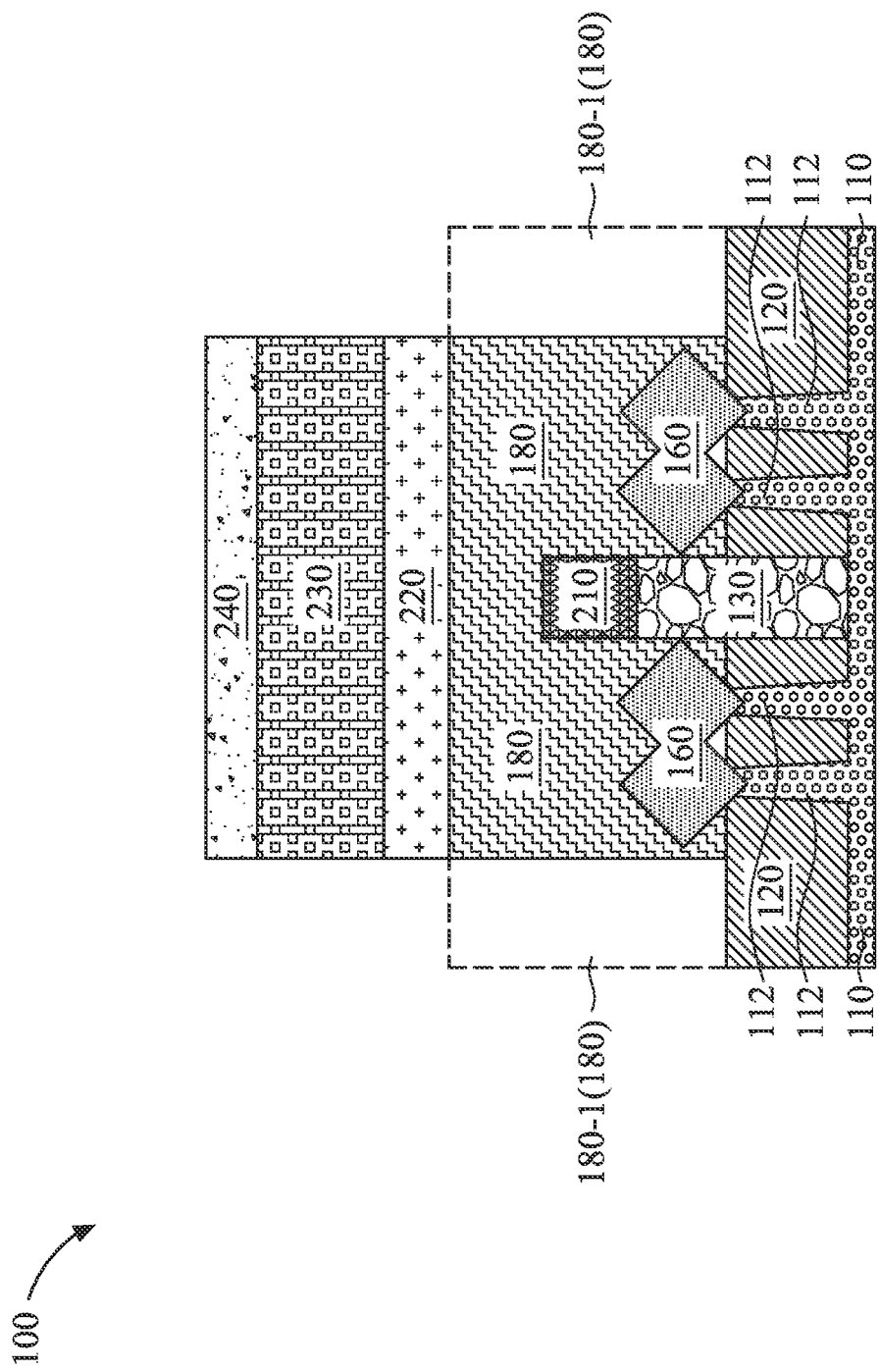
Figure 3B:
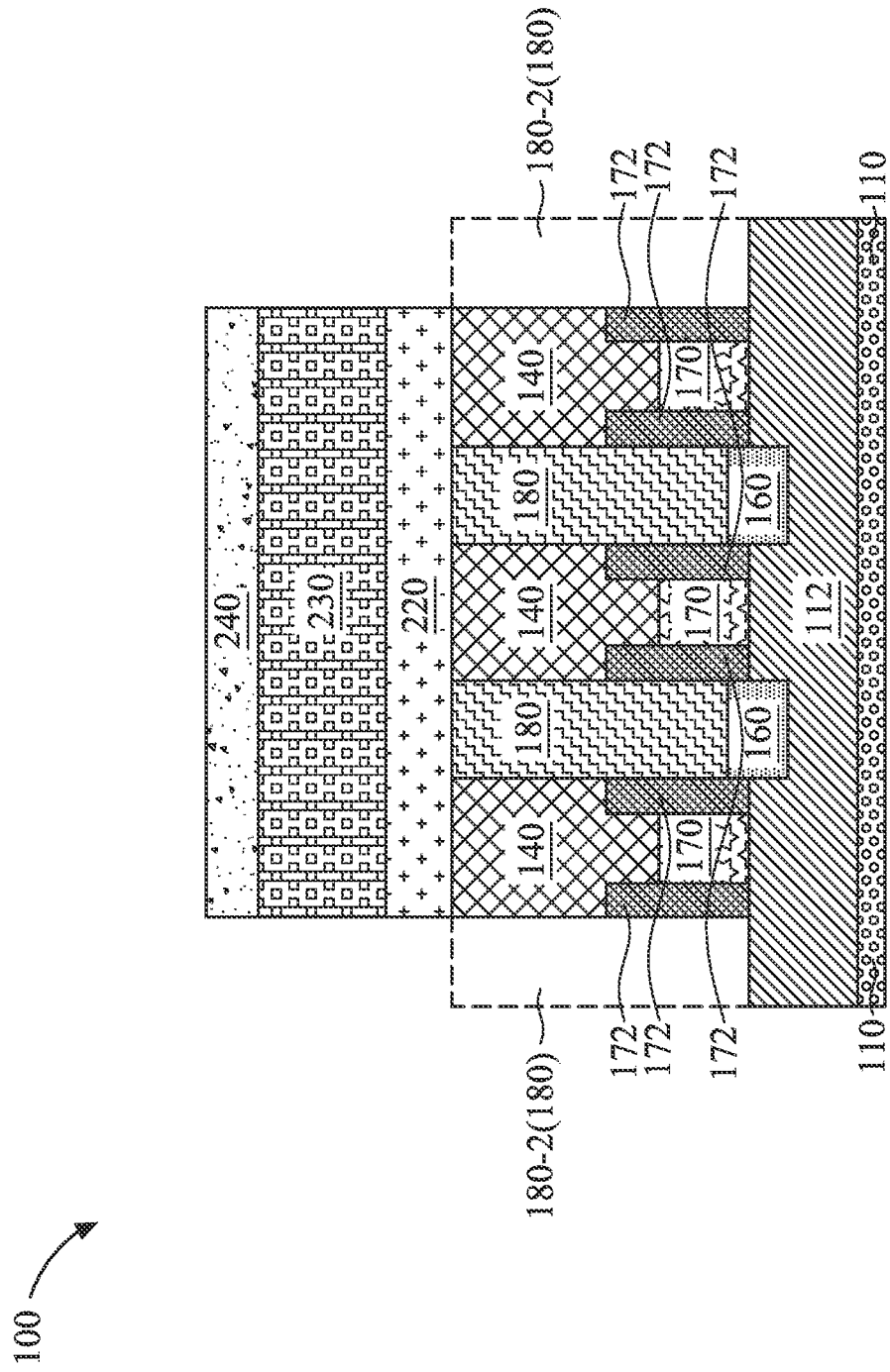
Figure 3C:
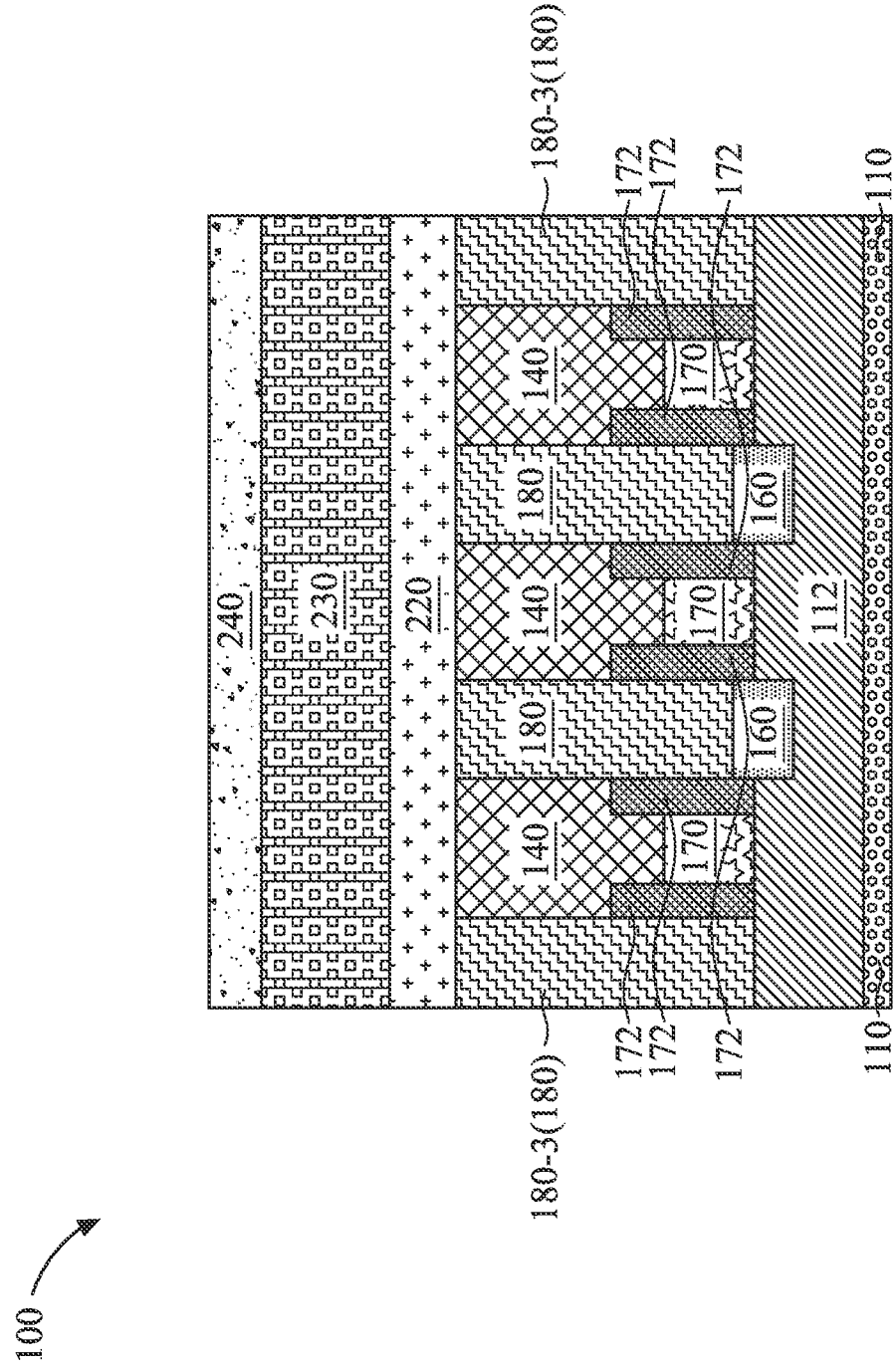

At operation 201, integrated circuit 100, which is partially formed, is provided (FIGS. 3A-C), at one of the various stages of fabrication. As shown in FIGS. 3A-C, integrated circuit 100 includes active fin structures 112 separated by STI 120, epitaxial regions 160 formed over the active fin structures 112, gate structures 170 surrounded by gate spacers 172, and inactive fin structure 130 disposed between two adjacent active fin structures 112. Further, such partially formed integrated circuit 100 can include dielectric structure 140 formed over the gate structures 170 (as shown in FIGS. 3B-C); ILD 180 formed over epitaxial regions 160 (as shown in FIGS. 3A-C); and an isolation structure 210 formed over inactive fin structure 130. In some embodiments, isolation structure 210 may be formed to isolate adjacent gate structures or gate portions, which may be later removed during the formation of conductive contact 150 (e.g., see FIG. 1B). Isolation structure 210 can include a metal oxide material such as, for example, hafnium oxide (HfOx), aluminum oxide (AlOx), zirconium oxide (ZrOx), and other suitable materials and combinations thereof.

Next, a number of patternable layers (e.g., 220, 230, 240) are formed over integrated circuit 100 to pattern ILD 180. Patternable layers 220, 230, and 240, which may be a bottom layer, a middle layer, and a photoresist 250, respectively, can be patterned in response to an exposure process for creating patterns, and those patterns can then be transferred to ILD 180 via one or more etching processes, as illustrated in FIGS. 3A-C. In various embodiments, a number of portions of ILD 180 are removed to be later filled with dielectric structure 140 that is configured to electrically isolate adjacent conductive contacts, which are sometimes referred to as "MD" structures. Accordingly, such a dielectric structure 140 is sometimes referred to as "cut MD."

For example in FIG. 3A, a first portion 180-1 of ILD 180 (indicated in dotted line) on the sides of the group of epitaxial regions 160 is removed. In some embodiments, the first portion 180-1 can extend in parallel with a lengthwise direction of the active/inactive fin structures 112/130 (e.g., direction 104, 106). For example in FIG. 3B, a second portion 180-1 of ILD 180 (also indicated in dotted line) on one of the sides of one of the gate structures 170 is removed. In some embodiments, the second portion 180-2 can extend in parallel with a lengthwise direction of the gate structures 170 (e.g., direction 102). For example in FIG. 3C, a third portion 180-3 of ILD 180 on one of the sides of one of the gate structures 170 may remain. In some embodiments, the third portion 180-3 can extend in parallel with a lengthwise direction of the gate structures 170 (e.g., direction 102).

Figure 4A:
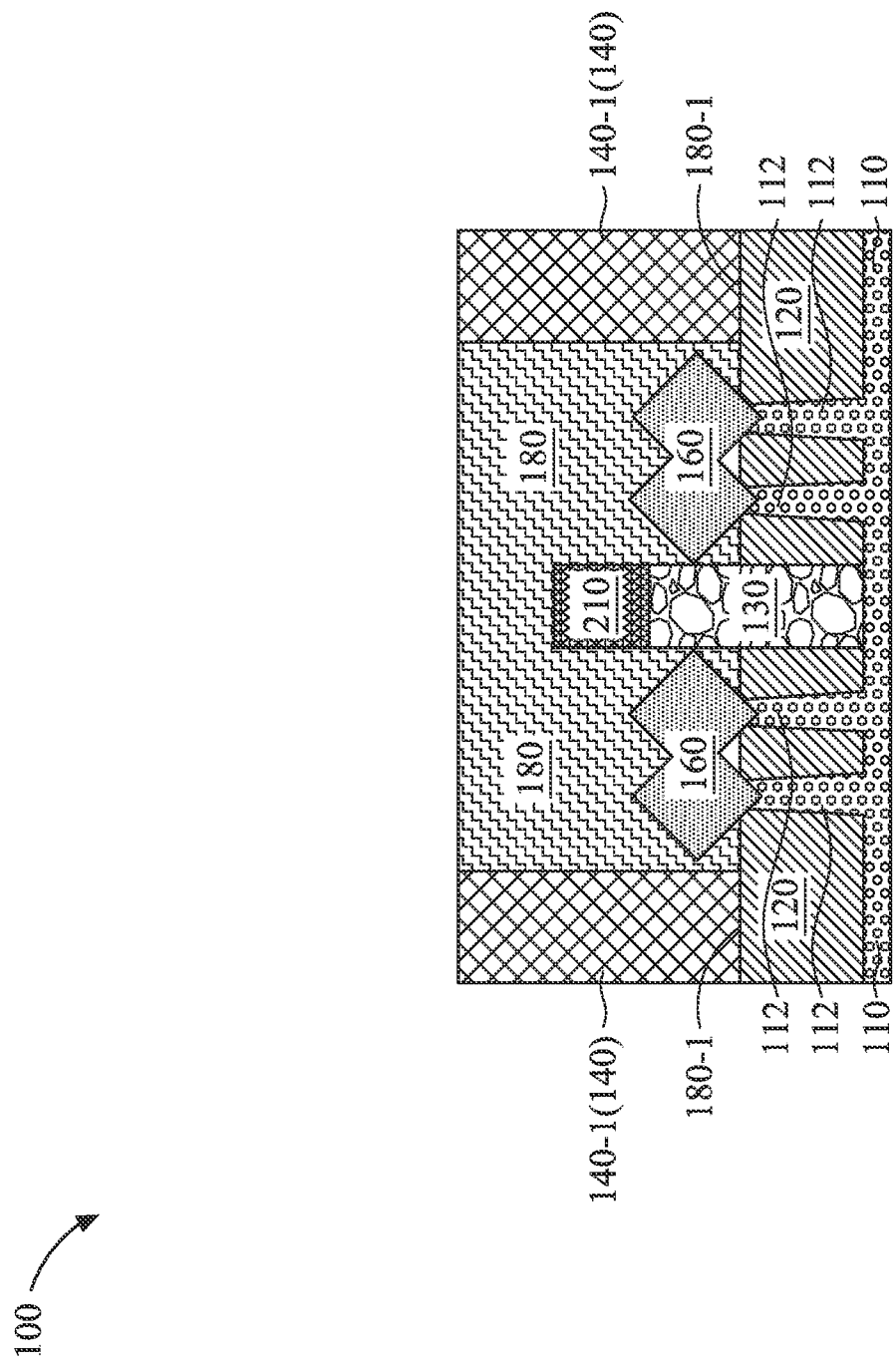
Figure 4B:
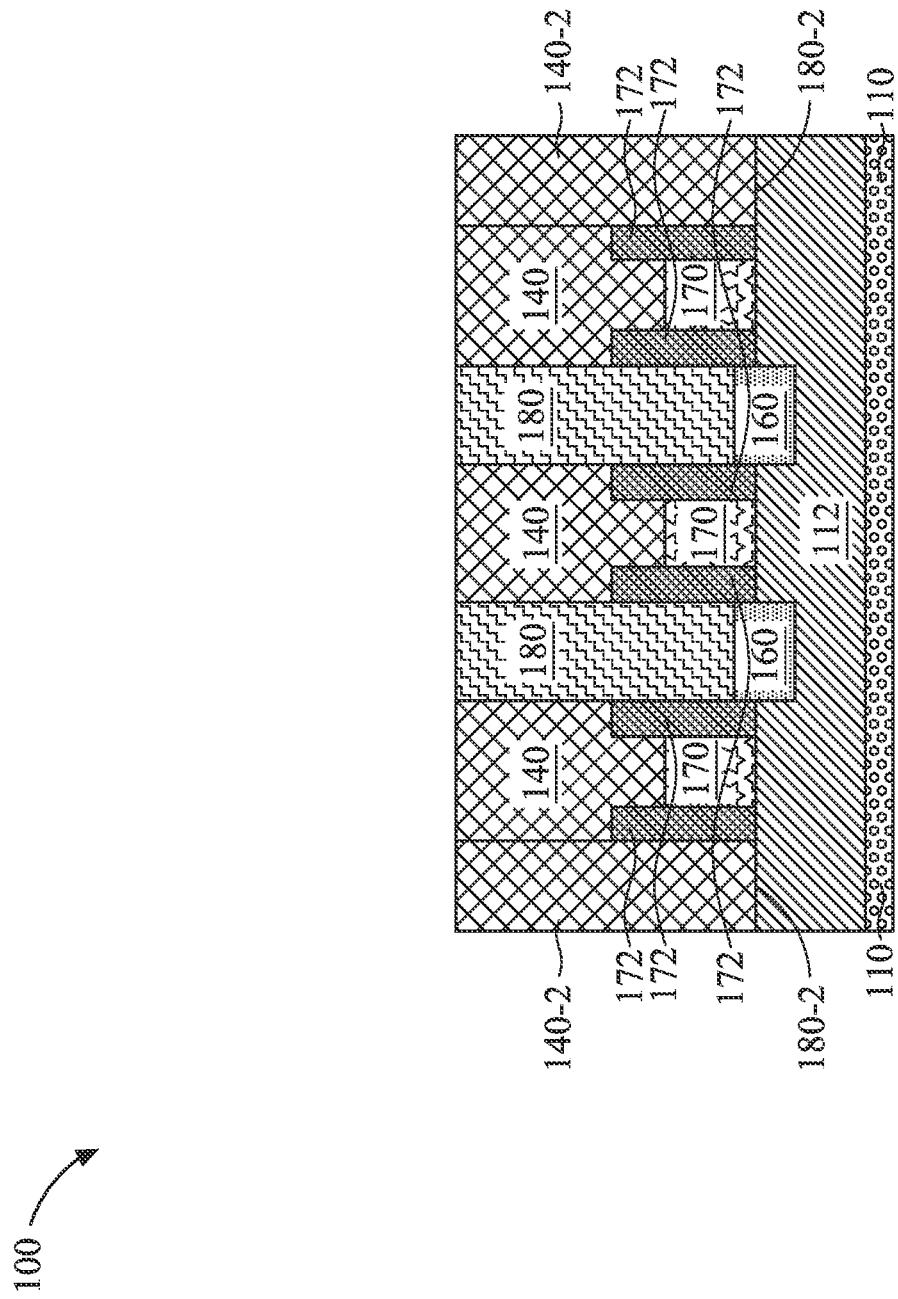
Figure 4C:
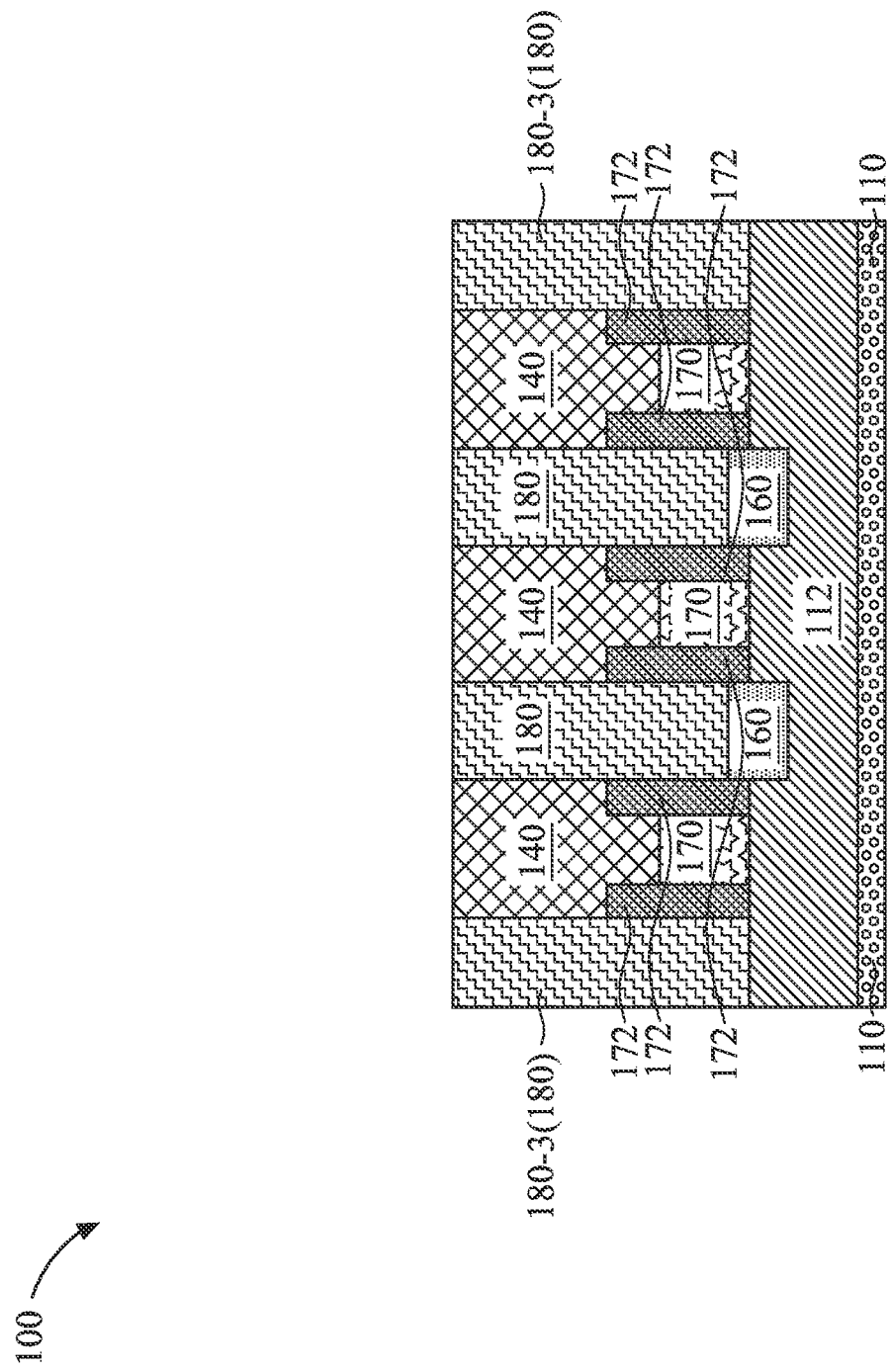
Figure 5A:
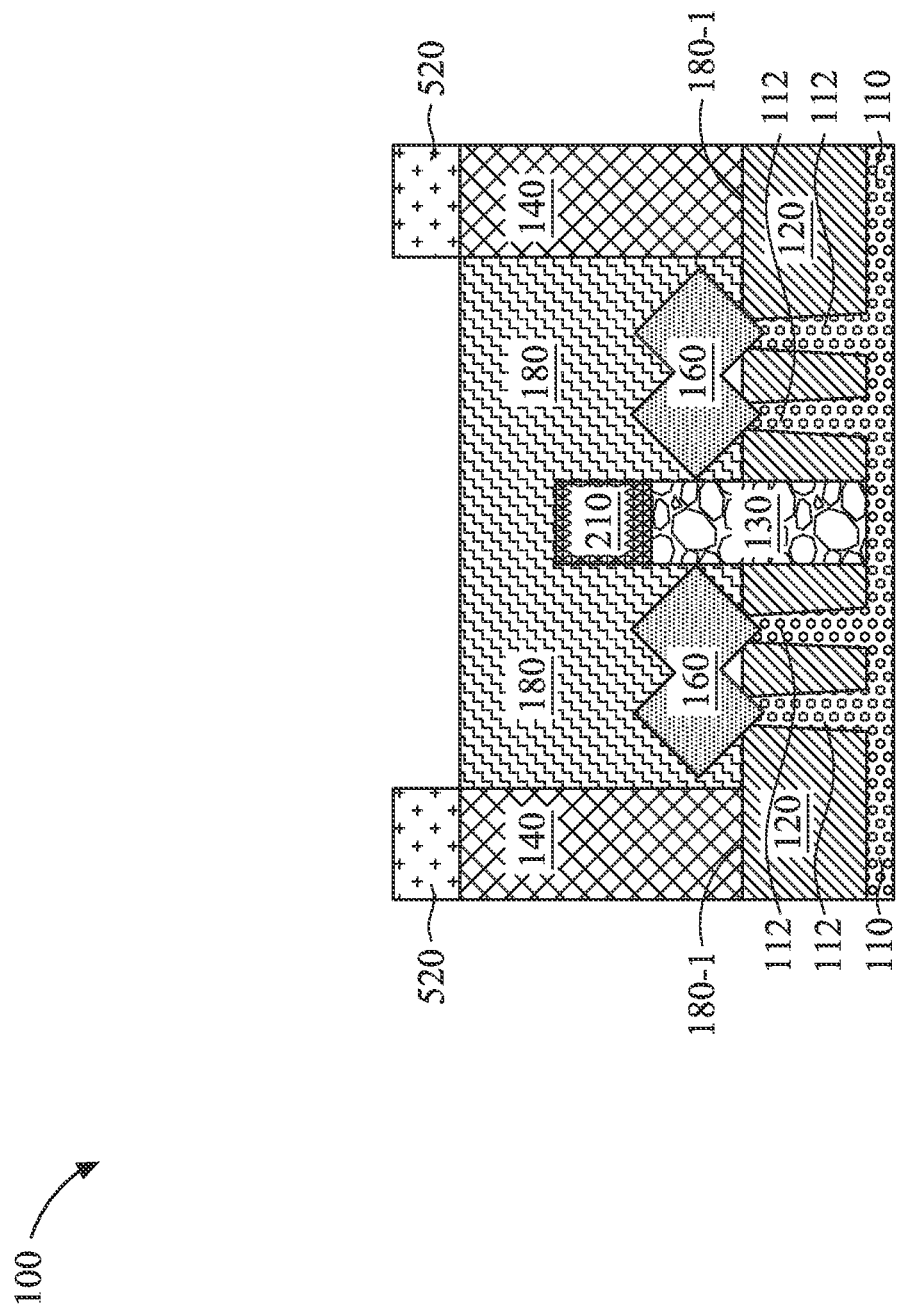
Figure 5B:
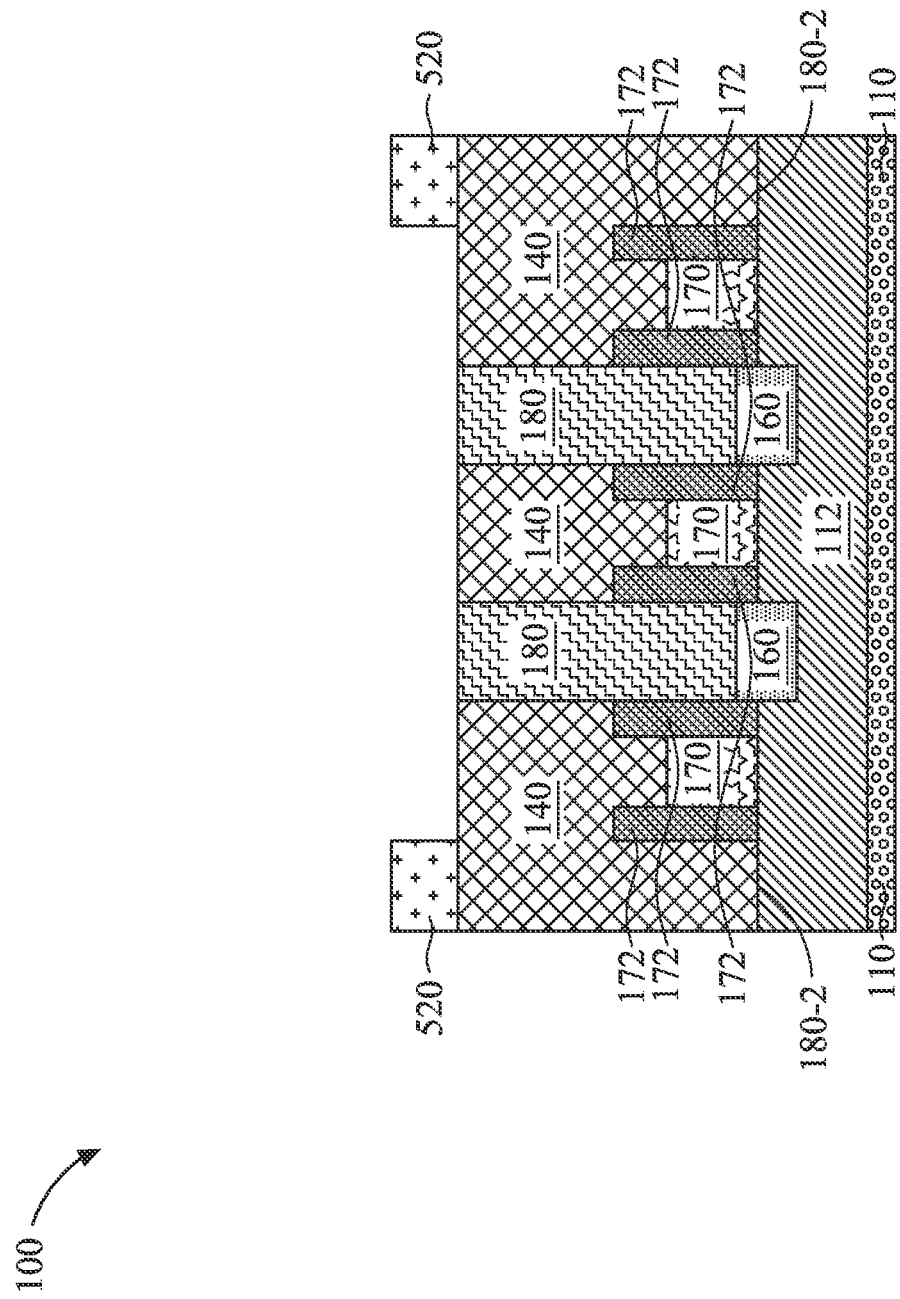
Figure 5C:
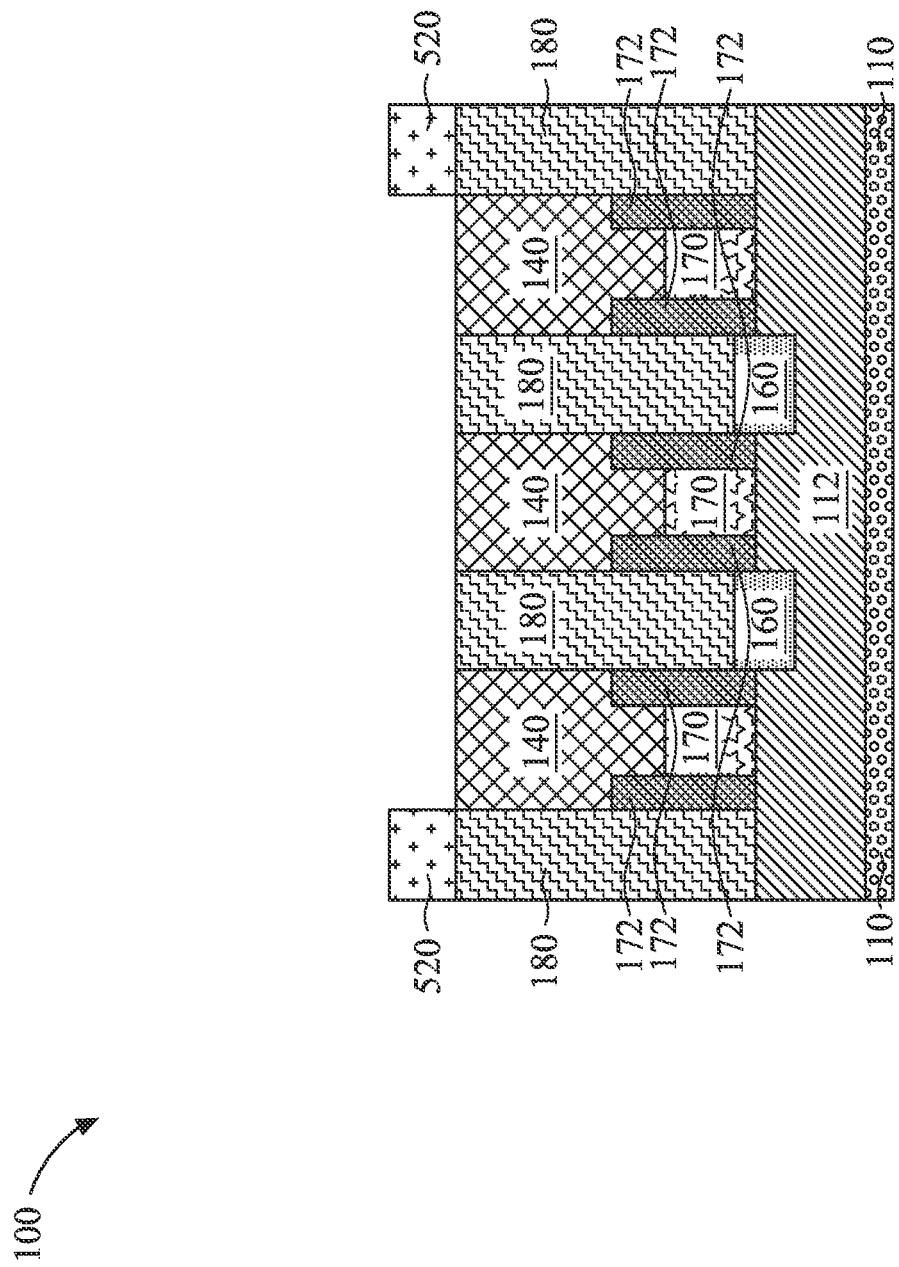

At operation 202, integrated circuit 100 includes additional dielectric structures 140 (sometimes referred to as cut MD) that are formed to isolate different portions of ILD 180 (FIGS. 4A-C), at one of the various stages of fabrication. As illustrated in FIG. 4A, the removed portion 180-1 is filled with a dielectric material (e.g., SiN) to form a dielectric structure 140-1; and as illustrated in FIG. 4B, the removed portion 180-2 is filled with a dielectric material (e.g., SiN) to form a dielectric structure 140-2. The dielectric structures 140-1 and 140-2 can inherit the profiles and dimensions of the removed portions 180-1 and 180-2, respectively. Further, dielectric structures 140-1 and 140-2 are formed with the same material as the original dielectric structure 140 (e.g., formed over the gate structures 170), and thus, the original and newly formed dielectric structure 140 can be integrally formed as a one-piece structure. In some embodiments, the dielectric structure 140 is formed as a two-dimensional mesh, with a number of "isolated" or "cut" ILD 180 disposed therein. Footprints of such isolated ILD 180 may be configured to define conductive contacts 150, as illustrated in FIG. 1A.

At operation 203, integrated circuit 100 includes a two-dimensional hard mask 520 (FIGS. 5A-C), at one of the various stages of fabrication. In various embodiments, hard mask 520 may surround an outline of integrated circuit 100 shown in FIG. 1A. Accordingly, hard mask 520 is seen as a pair of segments overlaying either ILD 180/dielectric structure 140 and aligned with their respective outer sidewalls in each of the cross-sectional views of FIGS. 5A-C. Such a hard mask may be configured to surround a group of MD structures, which may share similar formation conditions (e.g., similar etching conditions) and/or similar dimensions. Accordingly, hard mask 520 may sometimes be referred to as a "GMD HM."

To form hard mask 520, a multi-layer or a single-layer patterning scheme can be utilized. For example, a mask layer may be formed over ILD 180 and dielectric structure 140. Next, a bottom layer may be formed over the mask layer, and a middle layer may be formed over bottom layer. Next, a photoresist may be formed over the middle layer. The mask layer, bottom layer and middle layer can help facilitate the photolithography process performed using the photoresist. The mask layer can be implemented as a hard mask, for example, and can be formed using a variety of suitable materials. The bottom layer can be formed using a variety of suitable materials including carbon, oxygen, and hydrogen based materials. The middle layer can also be formed using a variety of suitable materials, including silicon, oxygen, and nitrogen based materials.

By patterning the resist layer, a pattern of the resist layer is transferred to the middle layer, to the bottom layer, and then to the mask layer by removing respective portions of the middle layer, bottom layer, and the mask layer. The respective portions of the middle layer, bottom layer, and the mask layer are removed using an etching technique, such as plasma etching, reactive ion etching, and other similar processes and combinations thereof. Etch chemicals such as carbon tetrafluoride ($CF_4$), nitrogen trifluoride ($NF_3$), chlorine ($Cl_2$), and other suitable etch chemicals can be used.

Figure 6A:
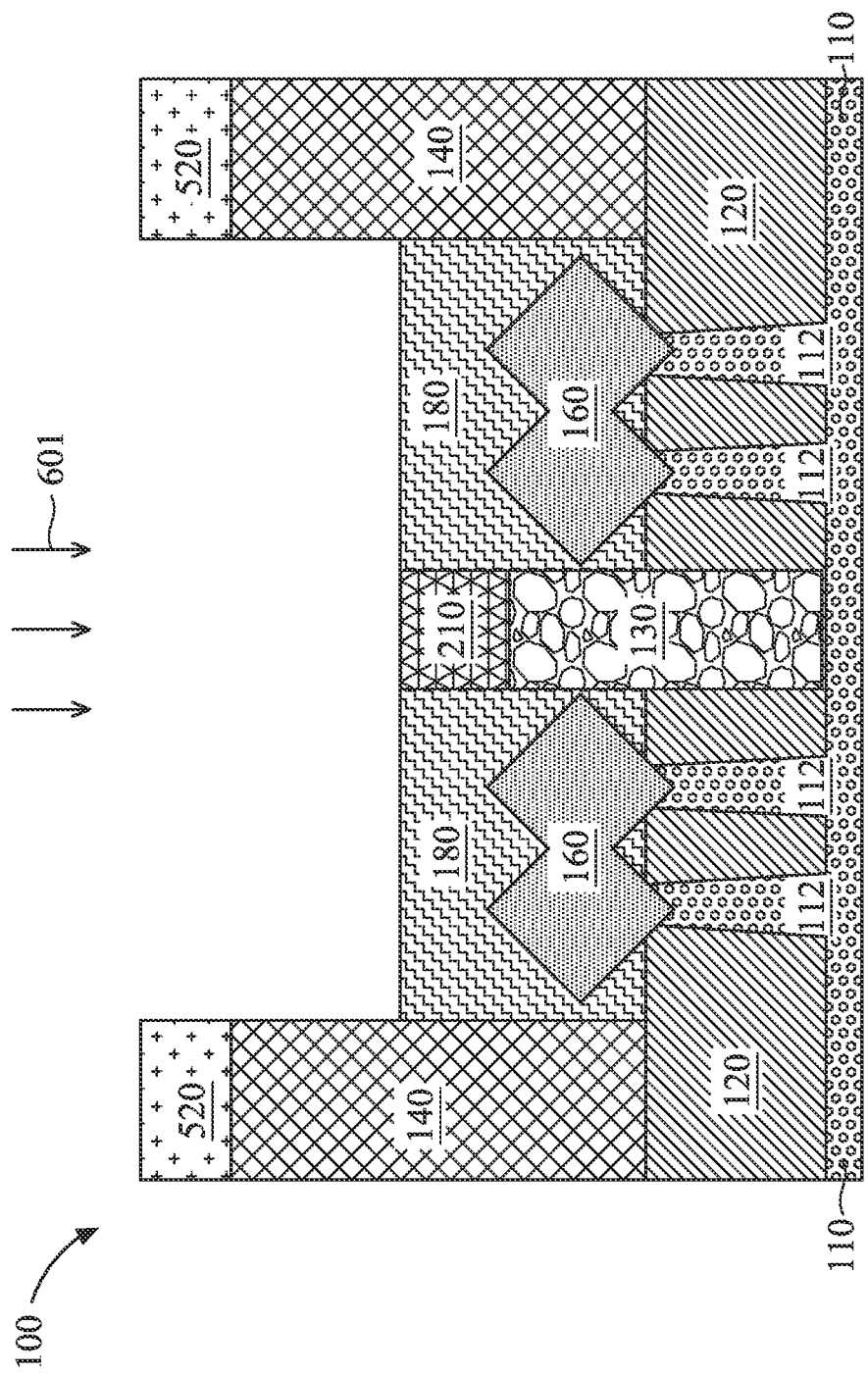
Figure 6B:
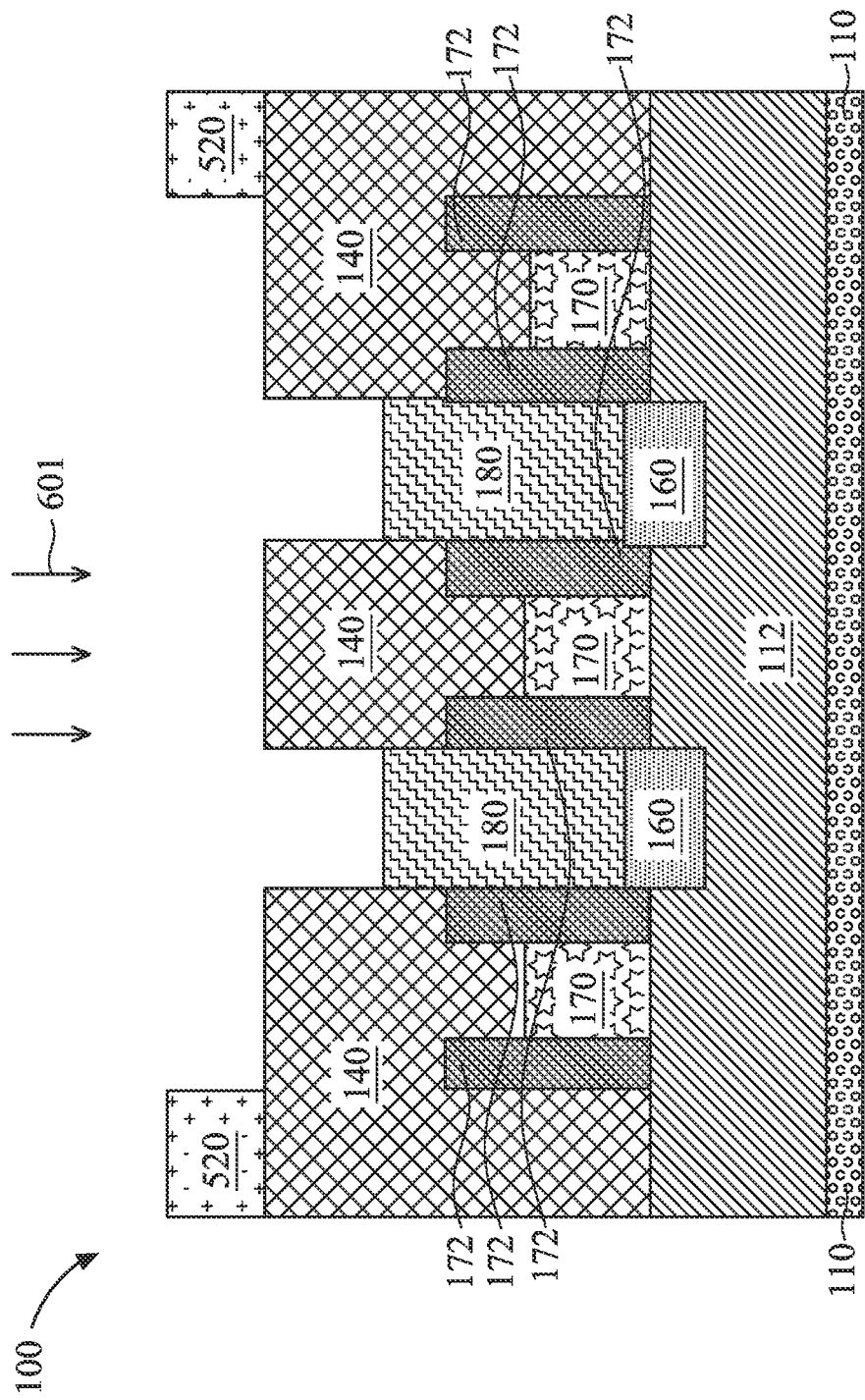
Figure 6C:
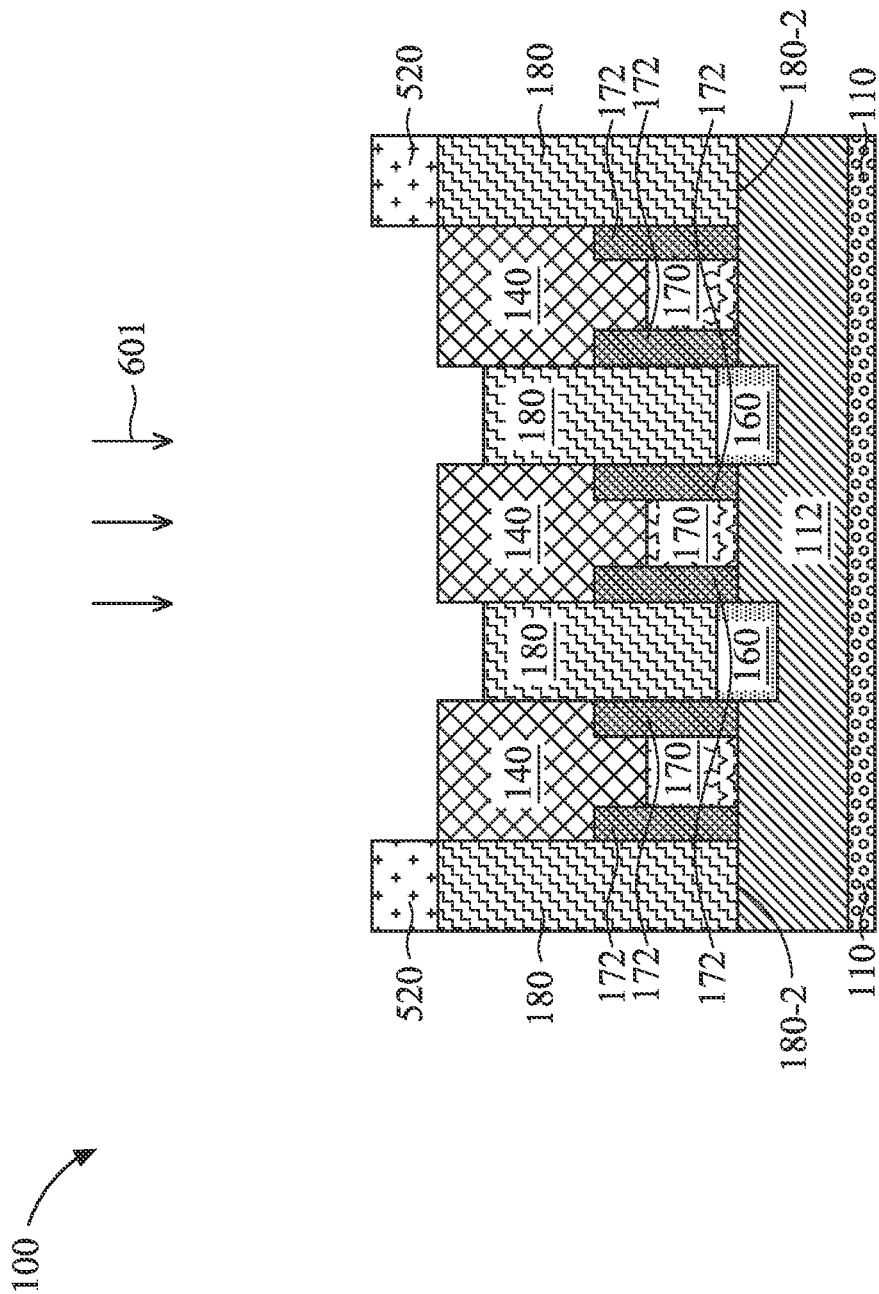

At operation 204, a first stage of etching process, 601, is performed on integrated circuit 100 (FIGS. 6A-C), at one of the various stages of fabrication. As illustrated in FIGS. 6A-C. 2G, a (e.g., upper) portion of ILD 180 is removed to expose the (metal-containing) isolation structure 210. In various embodiments, the first stage 601 can include an isotropic dry etching process, in which etch chemicals including hydrogen fluoride (HF), ammonia ($NH_3$), and other suitable etch chemicals and combinations thereof can be used. Further, the etch chemicals used in the first stage 601 can have an etching selectivity between ILD 180 and dielectric structure 140/hard mask 520. For example, when using the etch chemicals in the first stage 601, ILD 180 is etched a higher rate than dielectric structure 140 and hard mask 520, which facilitates the ability to perform isotropic etching in multiple directions in the first stage 601 without significant loss of material from isolation structure 210 and hard mask 520. As such, after operation 204, there may be no or little dielectric material from dielectric region 180 that remains above the top surface of isolation structure 210.

Figure 7A:
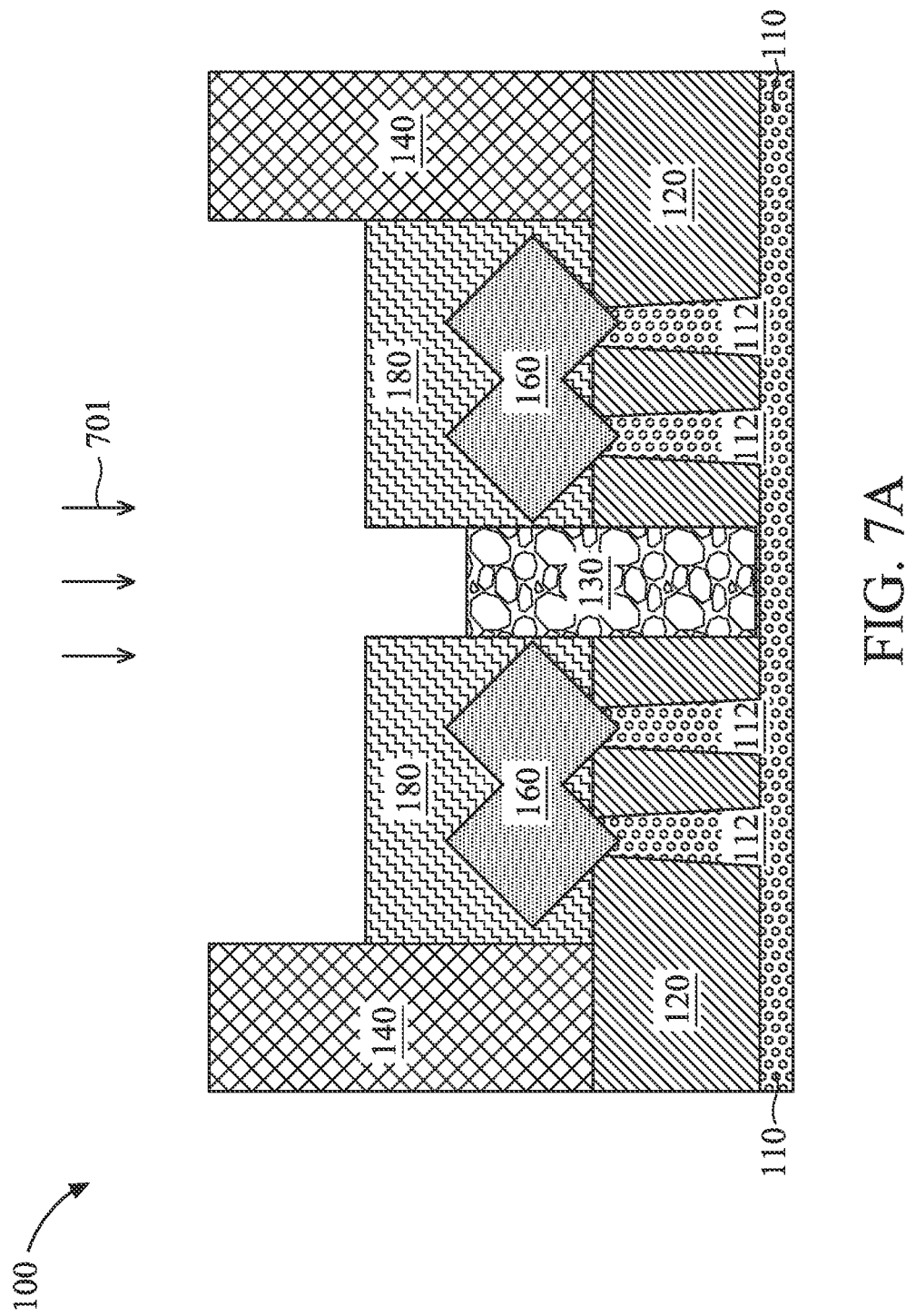
Figure 7B:
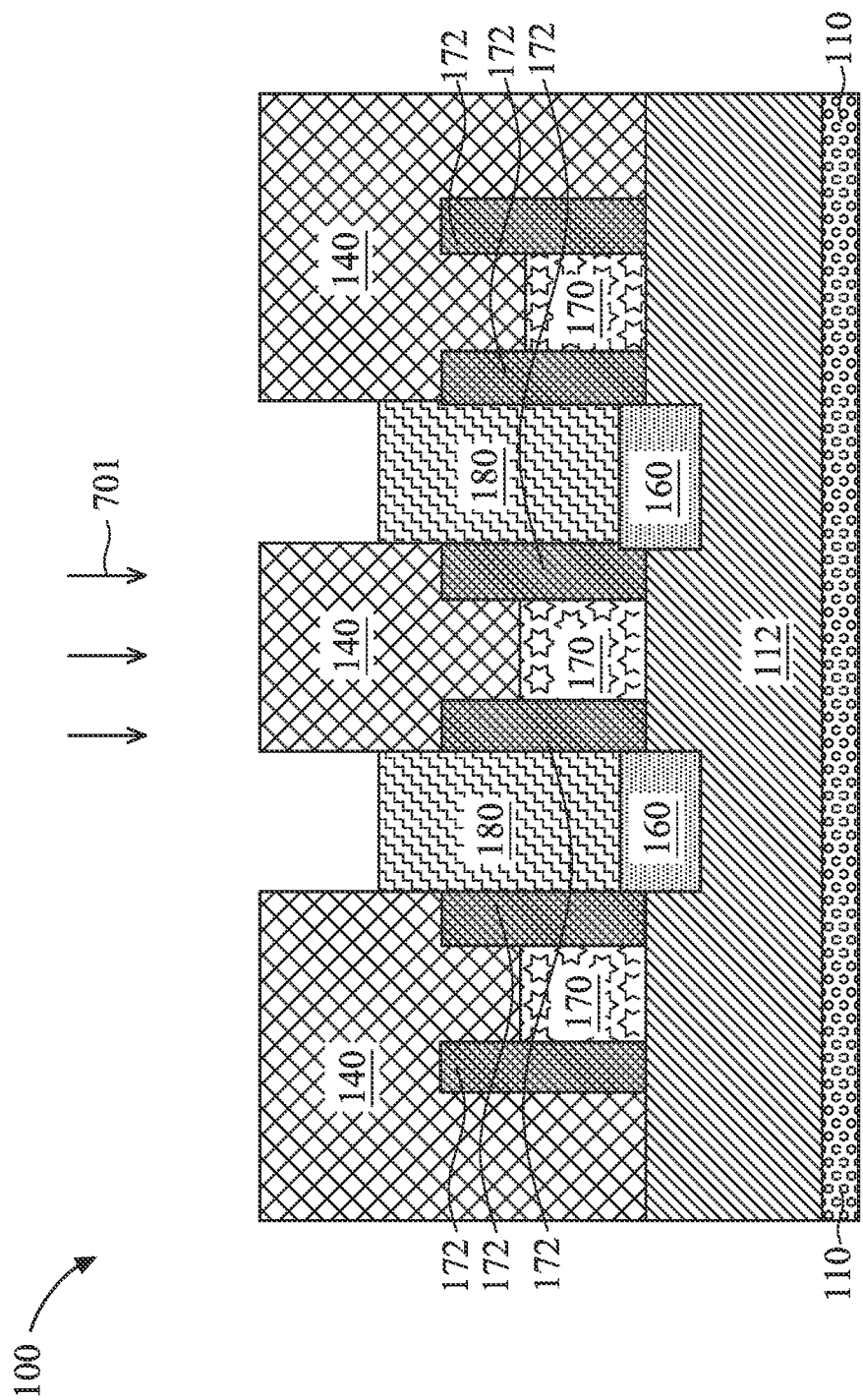
Figure 7C:
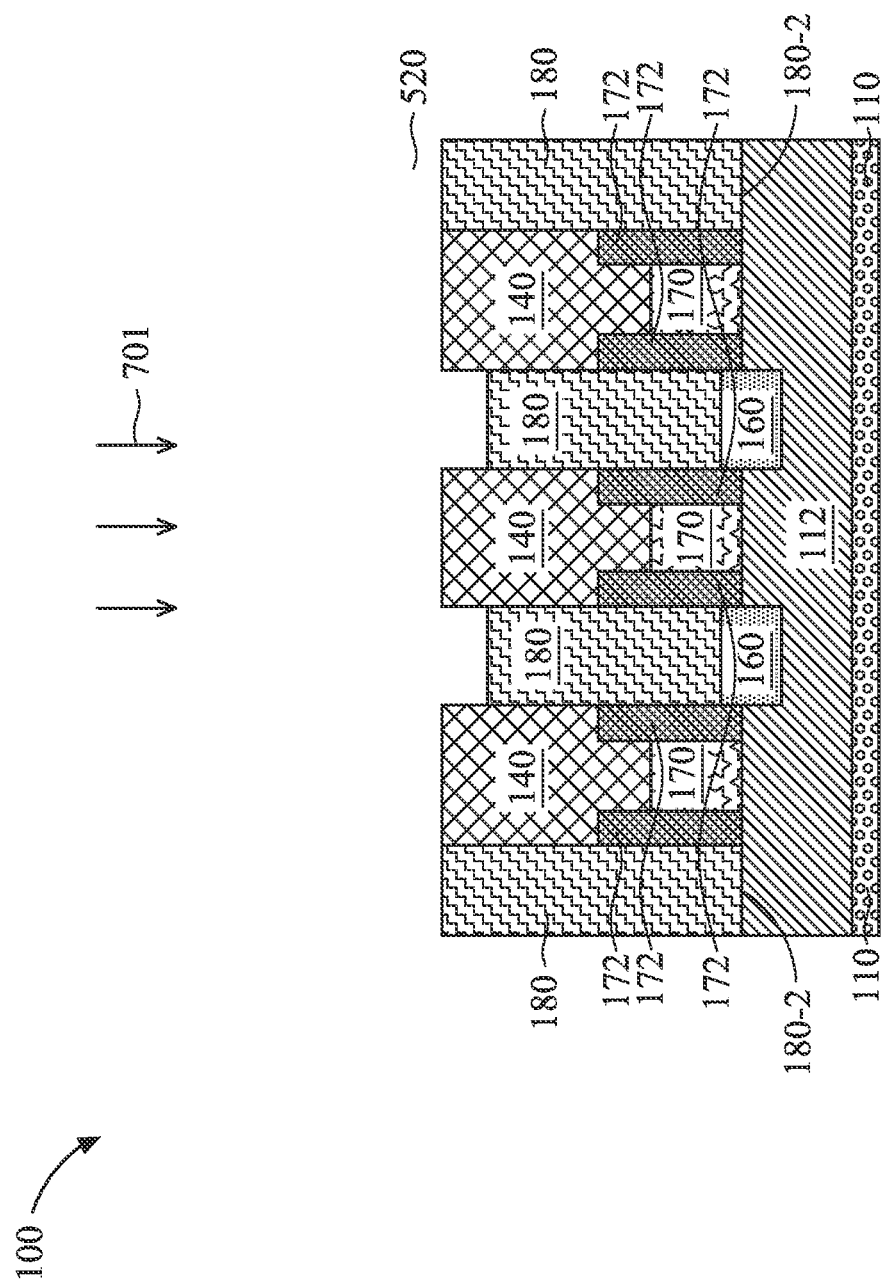

At operation 205, a second stage of etching process, 701, is performed on integrated circuit 100 (FIGS. 7A-C), at one of the various stages of fabrication. As illustrated in FIG. 7A, the exposed isolation structure 210 (FIG. 6A) is removed. Further, concurrently with removing the isolation structure 210, hard mask 520 (FIGS. 6A-C) may also be removed by the second stage 701. In various embodiments, the second stage 701 can include an isotropic dry etching process, in which etch chemicals including boron trichloride ($BCl_3$) and other suitable etching compounds can be used. Further, the etch chemicals used in the second stage 701 can have an etching selectivity between isolation structure 210/hard mask 520 and ILD 180/dielectric structure 140. For example, when using the etch chemicals in the second stage 701, isolation structure 210 and hard mask 520 are etched at a higher rate than ILD 180 and dielectric structure 140, which facilitates the ability to perform isotropic etching in multiple directions in the second stage 701 without significant loss of material from ILD 180/dielectric structure 140. As such, after operation 205, there may be no or little material from isolation structure 210 and hard mask 520 that remains above the top surface of isolation structure 210 and above the top surface of ILD 180/dielectric structure 140, respectively.

Figure 8B:
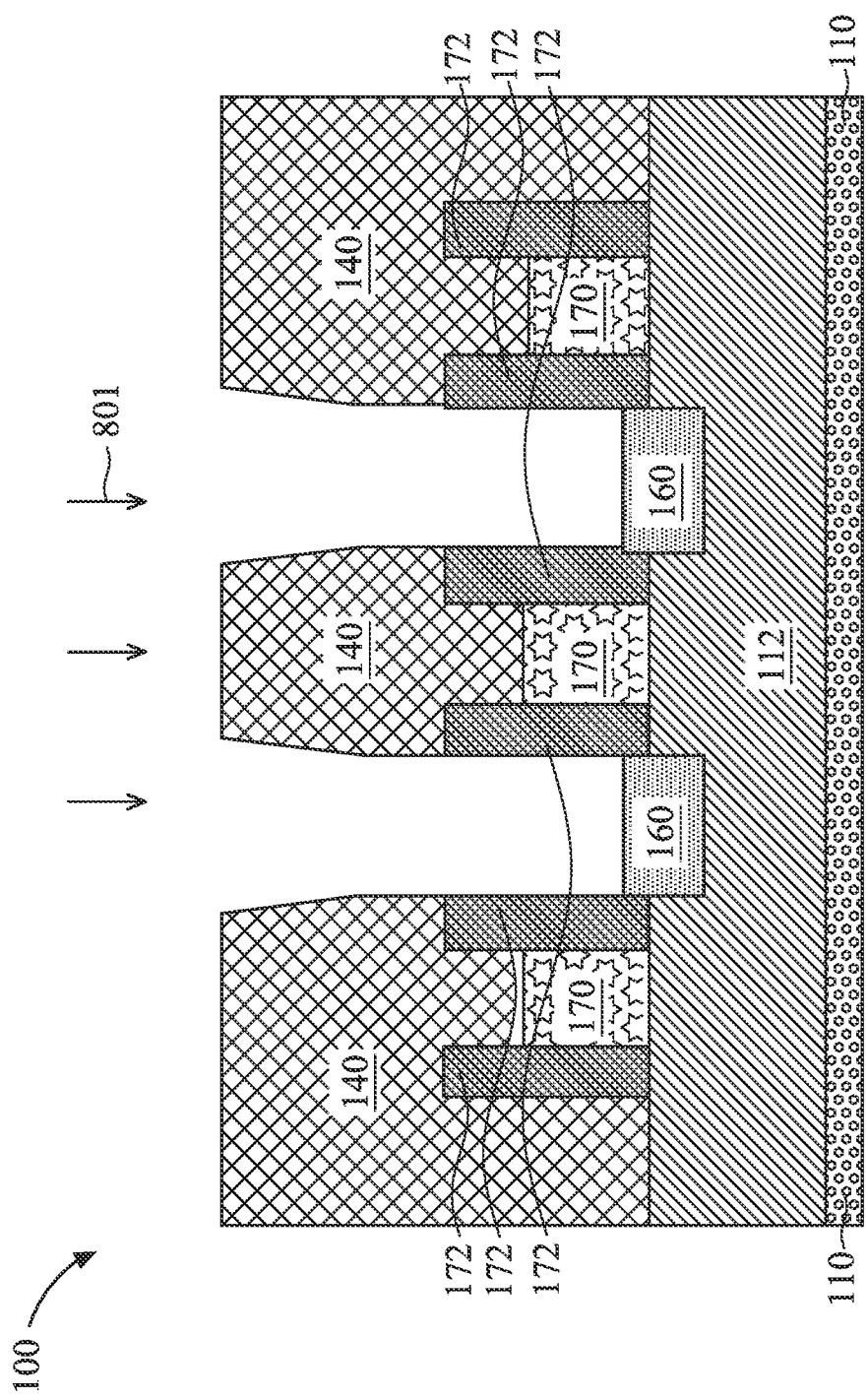
Figure 8C:
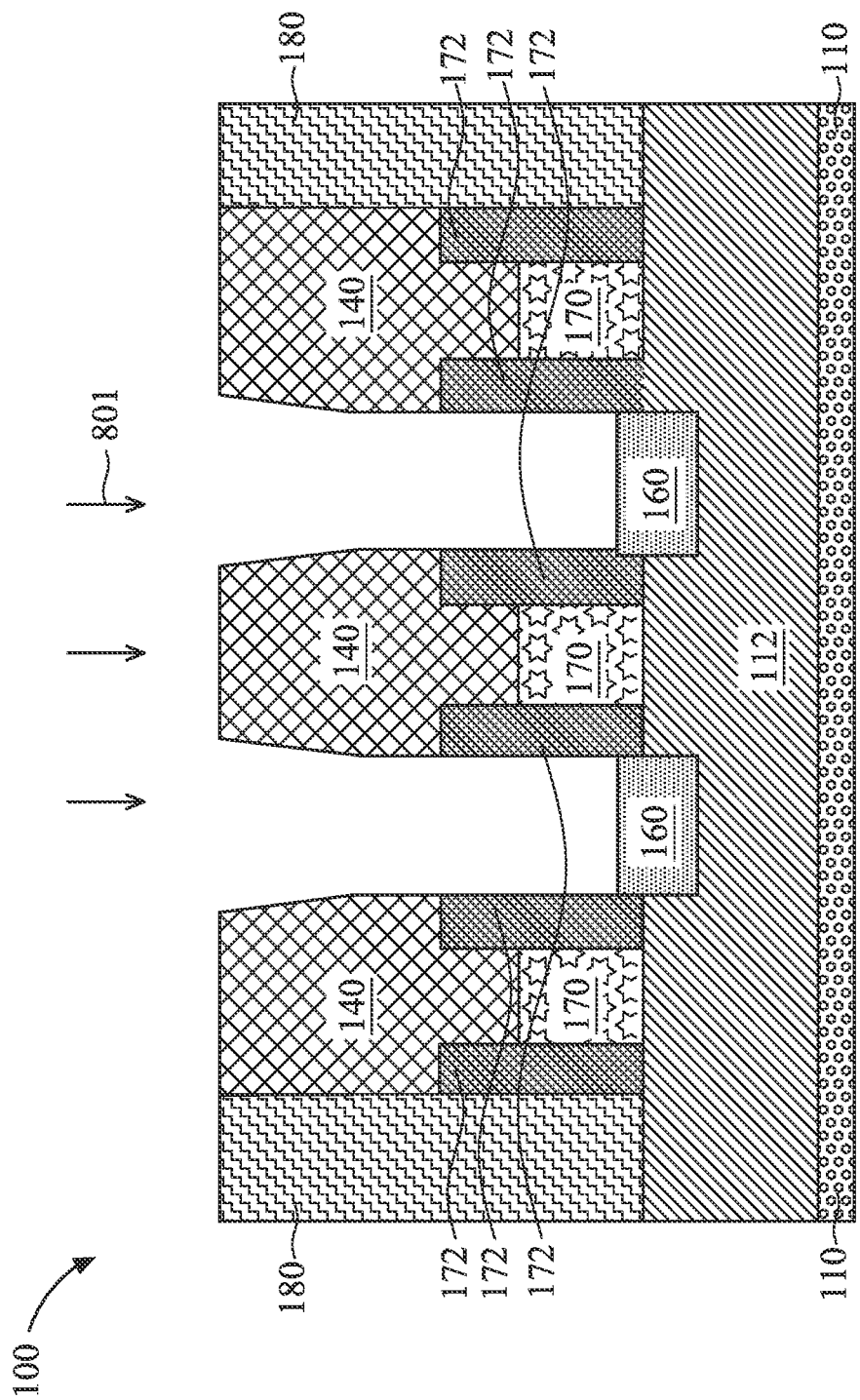
Figure 9A:
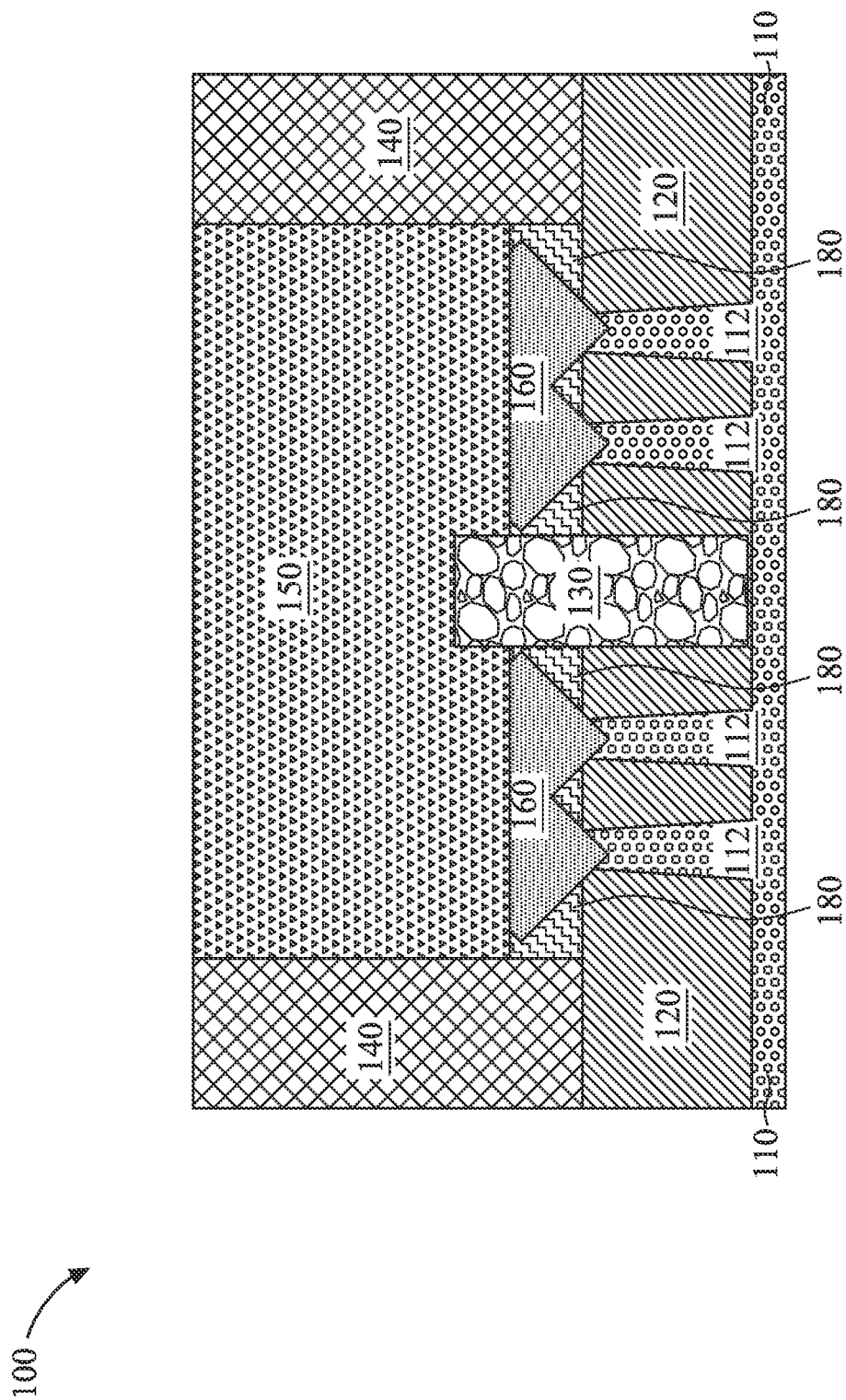
Figure 9B:
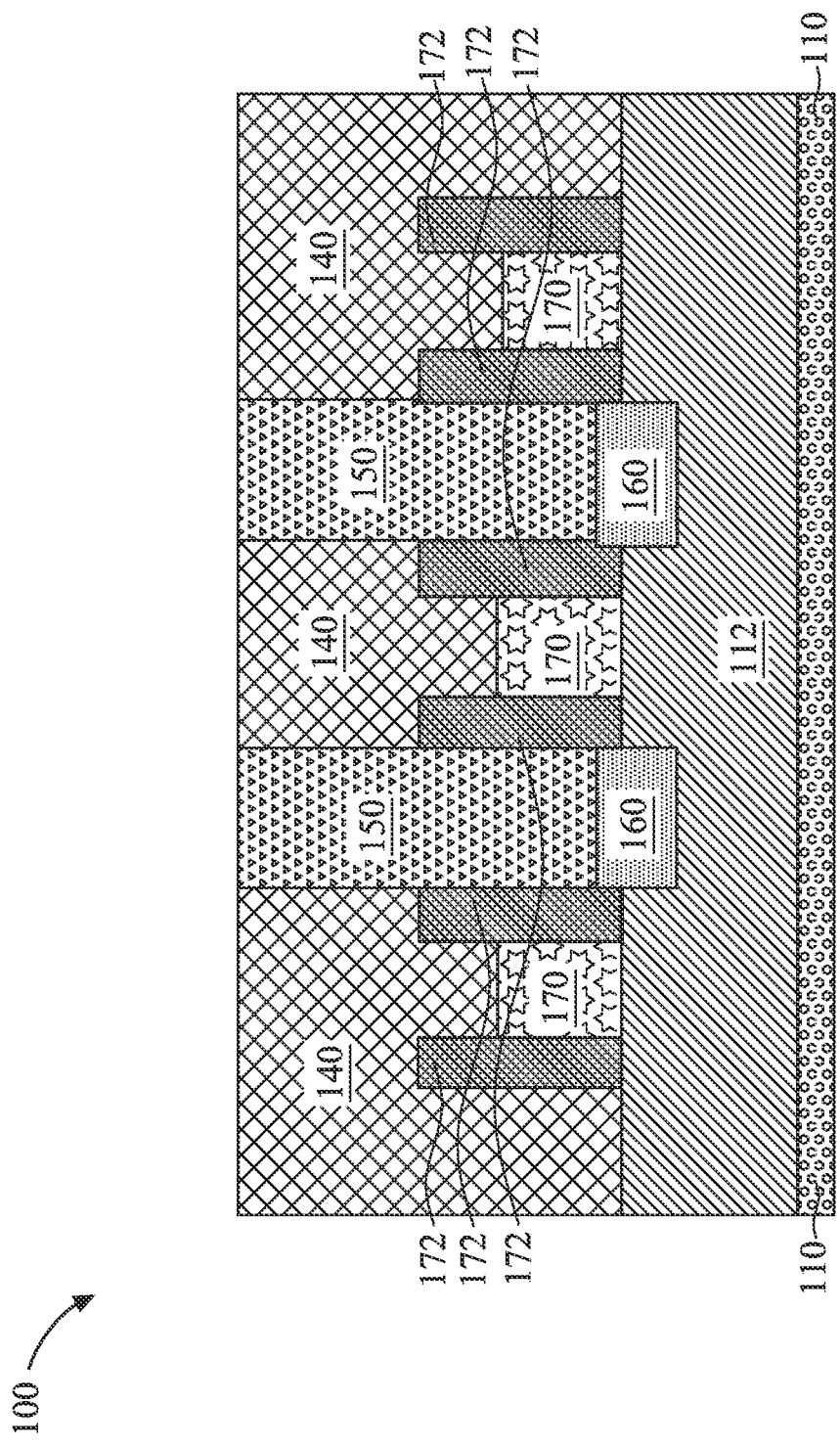
Figure 9C:
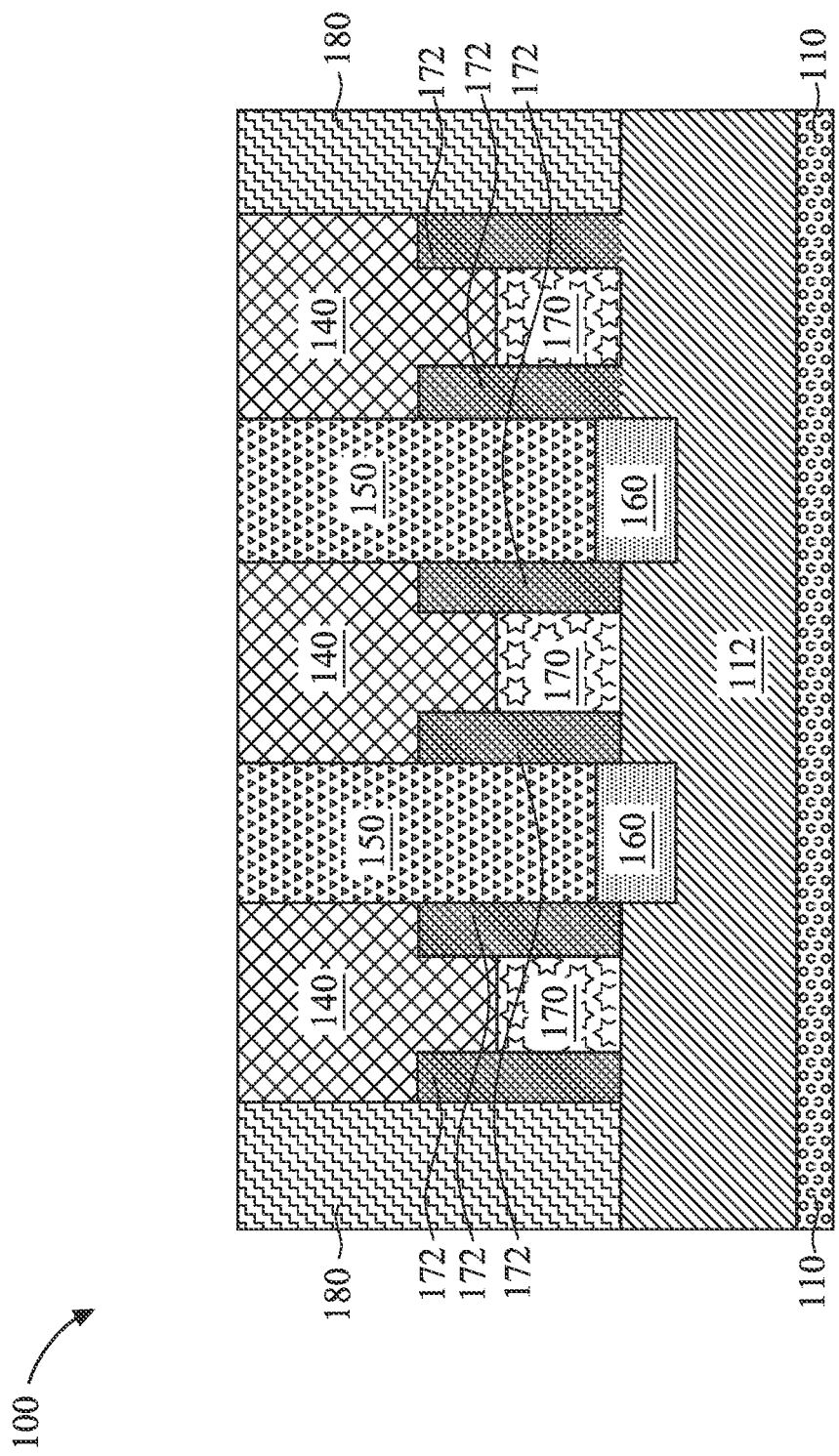

At operation 206, a third stage of etching process, 801, is performed on integrated circuit 100 (FIGS. 8A-C), at one of the various stages of fabrication. As illustrated in FIGS. 8A-C, a (e.g., middle) portion of ILD 180 is removed to expose epitaxial regions 160. Upon exposing epitaxial regions 160, a (e.g., lower) portion of ILD 180 may remain. Such a lower portion of ILD 180 may be disposed between epitaxial regions 160 and inactive fin structure 130, between epitaxial regions 160 and inner sidewalls of dielectric structure 140, or beneath epitaxial regions 160. In various embodiments, the third stage 801 can include an anisotropic dry etching process, in which etch chemicals including fluorocarbons ($C_4F_6$), oxygen ($O_2$), Argon (Ar), and other suitable etching compounds can be used. Further, the etch chemicals used in the third stage 801 can have an etch selectivity between ILD 180 and dielectric structure 140/inactive fin structure 130/gate spacer 172. For example, when using the etch chemicals in the third stage 801, ILD 180 is directionally (e.g., vertically) etched a higher rate than dielectric structure 140, inactive fin structure 130, and gate spacer 172, which retains the respective profiles and dimensions of dielectric structure 140, inactive fin structure 130, and gate spacer 172. As such, after operation 206, there may be no or little material loss from dielectric structure 140, inactive fin structure 130, and gate spacer 172.

At operation 207, integrated circuit 100 includes conductive contact 150 (FIGS. 8A-C), at one of the various stages of fabrication. In various embodiments, one or more conductive materials are formed over the exposed epitaxial regions 160 to form conductive contact 150. As mentioned above, conductive contact 150, which physically contacts epitaxial regions 160, is configured to electrically connect epitaxial regions 160 to other features. Referring again to FIG. 1A, such conductive contacts 150 may respectively be formed as a number of islands (e.g., electrically) separated by the mesh-like dielectric structure 140, which can be better appreciated in the different cross-sectional views of FIGS. 9A-C. In some embodiments, conductive contacts 150 may each extend in parallel with the lengthwise direction of gate structures. Further, each conductive contact 150 can be coupled to a group of epitaxial regions 160, which includes a pair of merged epitaxial regions that are separated by an inactive fin structure, as shown in the current example of FIGS. 9A-C. It should be understood that each conductive contact 150 can be coupled to any number of epitaxial regions, either being merged or separated, while remaining within the scope of the present disclosure.

Conductive contacts 150 can include a metal material. The metal material may include tungsten (W). Besides tungsten, other metal materials, such as copper (Cu), gold (Au), cobalt (Co), Ruthenium (Ru), combinations thereof, multi-layers thereof, alloys thereof, or the like, may also be used to form conductive contacts 150. Conductive contact 150 can be formed using a variety of suitable processes, including chemical vapor deposition (CVD), physical vapor deposition (PVD), electroplating, electroless plating, and other suitable processes and combinations thereof. Then, processes such as chemical mechanical planarization (CMP) are used to smooth the exposed surface of conductive contact 150, before forming structures such as conductive line 192, a dielectric layer 194, and a passivation layer 196 discussed above.

Although the above discussions are focused on exposing epitaxial regions 160 (and then forming conductive contacts 150) using a three-stage etching process, it should be understood that epitaxial regions 160 can also be formed using an etching process that includes any number of stages, in some other embodiments. For example, by forming the disclosed two-dimensional mesh-like dielectric structure 140, different portions of ILD 180, which respectively overlay different groups of epitaxial (source/drain) structures, can be isolated (see, e.g., operation 202 of FIG. 2). Next, a two-dimensional hard mask can be formed around such different portions of ILD 180 (see, e.g., operation 203 of FIG. 2). By etching the different portions of ILD 180 (e.g., using a single-stage anisotropic dry etching process), the etched portions can be filled with a metal material to form conductive contacts. Such an anisotropic dry etching process can include using etch chemicals that includes fluorocarbons ($C_4F_6$), oxygen ($O_2$), Argon (Ar), and other suitable etching compounds.

As described in detail above, the present disclosure provides a semiconductor device and method for fabricating a semiconductor device using a multi-stage etching process for formation of conductive contacts within the semiconductor device as implemented in an integrated circuit. The multi-stage etching process can achieve greater precision in certain applications as a result of using an added dielectric region with a relatively high etch selectivity. As a result, hard mask loss can be reduced, metal oxide can be removed from an inactive fin structure, and larger process windows can be formed among other possible benefits.

An implementation of the present disclosure is a of fabricating a semiconductor device. The method includes exposing a first portion of an interlayer dielectric (ILD) that overlays a first one of a plurality of groups of epitaxial regions. The method includes performing a first stage of etching process to remove an upper portion of the first portion of ILD. The method includes performing a second stage of etching process to remove an isolation structure disposed between neighboring epitaxial regions of the first group of epitaxial regions. The method includes performing a third stage of etching process to remove a middle portion of the first portion of ILD, thereby exposing the first group of epitaxial regions.

Another implementation of the present disclosure is a method of fabricating a semiconductor device. The method includes separating an interlayer dielectric (ILD) into a plurality of portions. The plurality of portions of ILD, separated from each other along a first lateral direction and a second lateral direction, overlay a plurality of groups of epitaxial regions, respectively. The method includes performing an etching process to expose the plurality of groups of epitaxial regions, wherein the etching process comprises a plurality of stages, each of the stages comprising a respective etchant. The method includes forming a plurality of conductive contacts electrically coupled to the plurality of epitaxial regions, respectively.

Yet another implementation of the present disclosure is a semiconductor device. The semiconductor device includes a plurality of groups of source/drain (S/D) structures. The semiconductor device includes a plurality of conductive contacts, wherein the plurality of conductive are electrically coupled to the plurality of groups of S/D structures, respectively. The semiconductor device includes a mesh-like dielectric structure separating the plurality of conductive contacts, wherein the plurality of conductive contacts are separated from each other along a first lateral direction and a second lateral direction that are perpendicular to each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    exposing a first portion of an interlayer dielectric (ILD) that overlays a first one of a plurality of groups of epitaxial regions;
    performing a first stage of etching process to remove an upper portion of the first portion of ILD;
    performing a second stage of etching process to remove an isolation structure disposed between neighboring epitaxial regions of the first group of epitaxial regions, thereby causing a middle portion of the first portion of ILD that still overlays the first group of epitaxial regions to be recessed, wherein the middle portion of the first portion of ILD is vertically arranged with respect to the upper portion of the first portion of ILD; and
    performing a third stage of etching process to remove the middle portion of the first portion of ILD, thereby exposing the first group of epitaxial regions.

2. The method of claim 1, further comprising forming a conductive contact that electrically couples to the first group of epitaxial regions.

3. The method of claim 1, wherein the first stage of etching process comprises an isotropic dry etching process that includes an etch chemical selected from the group consisting of hydrogen fluoride (HF), ammonia ($NH_3$), and combinations thereof.

4. The method of claim 1, wherein the second stage of etching process comprises an isotropic dry etching process that includes an etch chemical of boron trichloride ($BCl_3$).

5. The method of claim 1, wherein the third stage of etching process comprises an anisotropic dry etching process that includes an etch chemical selected from the group consisting of fluorocarbons ($C_4F_6$), oxygen ($O_2$), Argon (Ar), and combinations thereof.

6. The method of claim 1, wherein the step of performing a first stage of etching process further comprises exposing the isolation structure.

7. The method of claim 6, wherein the isolation structure is disposed above an inactive fin structure that is disposed between the neighboring epitaxial regions.

8. The method of claim 1, wherein the step of performing a second stage of etching process further removes a hard mask layer that surrounds the plurality of groups of epitaxial regions.

9. The method of claim 1, further comprising forming a mesh-like dielectric structure that separates the plurality of groups of epitaxial regions.

10. The method of claim 9, wherein the mesh-like dielectric structure includes a plurality of meshes filled with respective portions of the ILD.

11. A method of fabricating a semiconductor device, comprising:
exposing an interlayer dielectric (ILD) that overlays a first group of epitaxial regions and a second group of epitaxial regions, wherein the first group of epitaxial regions and the second group of epitaxial regions are separated from each other with an inactive fin covered by an isolation structure;
performing a first stage of etching process to remove an upper portion of the ILD, while exposing the isolation structure;
performing a second stage of etching process to remove the isolation structure, thereby causing a middle portion of the ILD that still overlays the first and second groups of epitaxial regions to be recessed, wherein the middle portion of the ILD is vertically arranged with respect to the upper portion of the ILD; and
performing a third stage of etching process to remove the middle portion of the ILD, thereby exposing the first group of epitaxial regions and the second group of epitaxial regions.

12. The method of claim 11, wherein the first stage of etching process comprises an isotropic dry etching process that includes an etch chemical selected from the group consisting of hydrogen fluoride (HF), ammonia ($NH_3$), and combinations thereof.

13. The method of claim 11, wherein the second stage of etching process comprises an isotropic dry etching process that includes an etch chemical of boron trichloride ($BCl_3$).

14. The method of claim 11, wherein the third stage of etching process comprises an anisotropic dry etching process that includes an etch chemical selected from the group consisting of fluorocarbons ($C_4F_6$), oxygen ($O_2$), Argon (Ar), and combinations thereof.

15. The method of claim 11, wherein the isolation structure includes a material selected from a group consisting of: hafnium oxide (HfOx), aluminum oxide (AlOx), zirconium oxide (ZrOx), and combinations thereof.

16. The method of claim 11, wherein the step of performing a second stage of etching process further comprises removing a hard mask layer that surrounds the first and second groups of epitaxial regions.

17. The method of claim 11, further comprising forming a conductive contact that electrically couples the first group of epitaxial regions to the second group of epitaxial regions.

18. The method of claim 17, wherein the conductive contact overlays the inactive fin.

19. A method of fabricating a semiconductor device, comprising:
exposing an interlayer dielectric (ILD) that overlays a first group of epitaxial regions and a second group of epitaxial regions, wherein the first group of epitaxial regions and the second group of epitaxial regions are separated from each other with an inactive fin covered by an isolation structure;
performing a first isotropic dry etching process to remove an upper portion of the ILD, while exposing the isolation structure;
performing a second isotropic dry etching process to remove the isolation structure, thereby causing a middle portion of the ILD that still overlays the first and second groups of epitaxial regions to be recessed, wherein the middle portion of the ILD is vertically arranged with respect to the upper portion of the ILD; and
performing an anisotropic dry etching process to remove the middle portion of the ILD, thereby exposing the first group of epitaxial regions and the second group of epitaxial regions.

20. The method of claim 19, further comprising forming a conductive contact that electrically couples the first group of epitaxial regions to the second group of epitaxial regions.

* * * * *